US009666762B2

(12) United States Patent
Lowes et al.

(10) Patent No.: US 9,666,762 B2
(45) Date of Patent: May 30, 2017

(54) MULTI-CHIP LIGHT EMITTER PACKAGES AND RELATED METHODS

(71) Applicant: CREE, Inc., Durham, NC (US)

(72) Inventors: Theodore Lowes, Lompoc, CA (US); Bernd P. Keller, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 59 days.

(21) Appl. No.: 13/796,954

(22) Filed: Mar. 12, 2013

(65) Prior Publication Data

US 2013/0270581 A1 Oct. 17, 2013

Related U.S. Application Data

(63) Continuation-in-part of application No. 13/441,620, filed on Apr. 6, 2012, now Pat. No. 9,082,921, which
(Continued)

(51) Int. Cl.
*H01L 33/44* (2010.01)
*H01L 33/46* (2010.01)
(Continued)

(52) U.S. Cl.
CPC .......... *H01L 33/48* (2013.01); *H01L 25/0753* (2013.01); *H01L 33/62* (2013.01);
(Continued)

(58) Field of Classification Search
CPC ....... H01L 33/44; H01L 33/505; H01L 33/54; H01L 33/58; H01L 33/42; H01L 33/60; H01L 33/46
(Continued)

(56) References Cited

U.S. PATENT DOCUMENTS 4,946,547 A   8/1990  Palmour
5,200,022 A   4/1993  Kong
(Continued)

FOREIGN PATENT DOCUMENTS

CN    ZL201230476421.3    5/2014
EP    002114934-0001      10/2012
(Continued)

OTHER PUBLICATIONS

Non-Final Office Action for U.S. Appl. No. 13/796,045 dated Aug. 21, 2014.
(Continued)

*Primary Examiner* — David Zarneke
(74) *Attorney, Agent, or Firm* — Jenkins, Wilson, Taylor & Hunt, P.A.

(57) ABSTRACT

Light emitter packages having multiple light emitter chips, such as light emitting diode (LED) chips, and related methods are provided. In one aspect, a light emitter package can include a submount, an array of light emitter chips disposed on a portion of the submount, and a lens provided over the submount and covering at least portions of the array. In some aspects, at least some of the light emitter chips can be adapted to emit light of a first dominant wavelength. In further aspects, at least some other light emitter chips are adapted to emit light of a second dominant wavelength that is different than the first dominant wavelength. In some aspects, the lens can be asymmetric. In some aspects, a collective center of the chips, or a center of an array of chips can be offset from a center of the asymmetric lens.

23 Claims, 13 Drawing Sheets

Related U.S. Application Data is a continuation-in-part of application No. 11/982,275, filed on Oct. 31, 2007, now Pat. No. 9,070,850, and a continuation-in-part of application No. 13/017,502, filed on Jan. 31, 2011, now Pat. No. 9,041,042.

(60) Provisional application No. 61/384,623, filed on Sep. 20, 2010, provisional application No. 61/390,963, filed on Oct. 7, 2010.

(51) Int. Cl.
*H01L 33/48* (2010.01)
*H01L 33/50* (2010.01)
*H01L 33/54* (2010.01)
*H01L 33/60* (2010.01)
*H01L 25/075* (2006.01)
*H01L 33/62* (2010.01)
*H01L 33/64* (2010.01)
*H01L 33/58* (2010.01)
*H01L 33/40* (2010.01)
*H01L 23/00* (2006.01)

(52) U.S. Cl.
CPC .............. *H01L 33/64* (2013.01); *H01L 24/48* (2013.01); *H01L 24/49* (2013.01); *H01L 24/73* (2013.01); *H01L 33/405* (2013.01); *H01L 33/44* (2013.01); *H01L 33/46* (2013.01); *H01L 33/505* (2013.01); *H01L 33/54* (2013.01); *H01L 33/58* (2013.01); *H01L 33/60* (2013.01); *H01L 33/647* (2013.01); *H01L 2224/32225* (2013.01); *H01L 2224/48091* (2013.01); *H01L 2224/48137* (2013.01); *H01L 2224/48227* (2013.01); *H01L 2224/73265* (2013.01); *H01L 2924/00014* (2013.01); *H01L 2924/01019* (2013.01); *H01L 2924/01087* (2013.01); *H01L 2924/01322* (2013.01); *H01L 2924/12041* (2013.01); *H01L 2924/12042* (2013.01)

(58) Field of Classification Search
USPC ......................................................... 257/98
See application file for complete search history.

(56) References Cited

U.S. PATENT DOCUMENTS

| | | | |
|---|---|---|---|
| RE34,861 E | 2/1995 | Davis | |
| 5,924,788 A * | 7/1999 | Parkyn, Jr. ................. | F21V 5/04 362/249.02 |
| 6,273,596 B1 * | 8/2001 | Parkyn, Jr. .............. | F21V 5/048 362/292 |
| 6,410,940 B1 | 6/2002 | Jiang et al. | |
| 6,853,010 B2 | 2/2005 | Slater, Jr. | |
| 7,213,940 B1 | 5/2007 | Van De Ven | |
| 7,244,965 B2 | 7/2007 | Andrews et al. | |
| 7,549,786 B2 | 6/2009 | Higley | |
| 7,550,319 B2 | 6/2009 | Wang et al. | |
| 7,790,485 B2 | 9/2010 | Nomura et al. | |
| 7,791,061 B2 | 9/2010 | Edmond | |
| 7,821,023 B2 | 10/2010 | Yuan | |
| D634,718 S | 3/2011 | Chuang et al. | |
| 7,967,652 B2 | 6/2011 | Emerson | |
| 8,044,418 B2 | 10/2011 | Loh et al. | |
| 8,058,088 B2 | 11/2011 | Cannon | |
| D650,343 S | 12/2011 | Andrews et al. | |
| 8,113,699 B2 | 2/2012 | Tsutsumi | |
| D658,139 S | 4/2012 | Andrews et al. | |
| 8,247,957 B2 * | 8/2012 | Chen ........................ | F21V 5/04 313/110 |
| 8,267,550 B2 | 9/2012 | Wang | |
| 8,309,974 B2 | 11/2012 | Nakayama et al. | |
| 8,337,214 B2 | 12/2012 | Sheek | |
| 8,379,407 B2 | 2/2013 | Bibee | |
| 8,421,089 B2 | 4/2013 | Kim | |
| D703,624 S | 4/2014 | Andrews et al. | |
| D704,154 S | 5/2014 | Andrews et al. | |
| 9,041,042 B2 * | 5/2015 | Andrews ............. | H01L 25/0753 257/99 |
| 9,070,850 B2 * | 6/2015 | Keller ..................... | H01L 33/62 |
| 9,082,921 B2 * | 7/2015 | Wilcox .................... | H01L 33/08 |
| 9,172,012 B2 * | 10/2015 | Andrews ............. | H01L 25/0753 |
| 2002/0085390 A1 | 7/2002 | Kiyomoto et al. | |
| 2004/0037076 A1 * | 2/2004 | Katoh ..................... | H01L 33/54 362/235 |
| 2006/0034097 A1 * | 2/2006 | Hahm ..................... | H01L 33/58 362/555 |
| 2006/0105485 A1 * | 5/2006 | Basin ..................... | H01L 24/97 438/27 |
| 2007/0057364 A1 | 3/2007 | Wang et al. | |
| 2007/0097705 A1 * | 5/2007 | Jung .................. | G02F 1/133606 362/613 |
| 2007/0120137 A1 * | 5/2007 | Wilson ................. | B60Q 1/0041 257/98 |
| 2007/0158668 A1 | 7/2007 | Tarsa | |
| 2007/0241357 A1 * | 10/2007 | Yan ..................... | H01L 25/0753 257/98 |
| 2008/0054286 A1 | 3/2008 | Loh et al. | |
| 2008/0105886 A1 * | 5/2008 | Borner .................... | H01L 33/60 257/98 |
| 2008/0173884 A1 | 7/2008 | Chitnis | |
| 2008/0179611 A1 | 7/2008 | Chitnis | |
| 2008/0203412 A1 * | 8/2008 | Shyu ...................... | H01L 33/58 257/98 |
| 2008/0258130 A1 | 10/2008 | Bergmann | |
| 2008/0272380 A1 * | 11/2008 | Wilcox ................... | F21S 8/086 257/88 |
| 2008/0291688 A1 * | 11/2008 | Higashi ................ | F21S 48/1159 362/516 |
| 2009/0039379 A1 | 2/2009 | Shiraishi et al. | |
| 2009/0045421 A1 * | 2/2009 | Ho .......................... | H01L 33/54 257/98 |
| 2009/0108281 A1 | 4/2009 | Keller | |
| 2009/0283787 A1 | 11/2009 | Donofrio | |
| 2010/0149771 A1 | 6/2010 | Villard | |
| 2010/0155763 A1 | 6/2010 | Donofrio | |
| 2010/0258819 A1 | 10/2010 | Marfeld et al. | |
| 2010/0259916 A1 | 10/2010 | Sun | |
| 2011/0026247 A1 * | 2/2011 | Zhang ...................... | F21V 5/04 362/235 |
| 2011/0068696 A1 | 3/2011 | Van De Ven | |
| 2011/0068702 A1 | 3/2011 | Van De Ven | |
| 2011/0090691 A1 | 4/2011 | Markle | |
| 2011/0220929 A1 | 9/2011 | Collins | |
| 2011/0309396 A1 | 12/2011 | Wang et al. | |
| 2012/0068198 A1 | 3/2012 | Andrews | |
| 2012/0091496 A1 | 4/2012 | Chien et al. | |
| 2012/0193648 A1 | 8/2012 | Donofrio | |
| 2012/0193649 A1 | 8/2012 | Donofrio | |
| 2012/0193660 A1 | 8/2012 | Donofrio | |
| 2012/0305949 A1 | 12/2012 | Donofrio | |
| 2013/0092960 A1 * | 4/2013 | Wilcox ................... | H01L 33/08 257/88 |
| 2013/0160248 A1 | 6/2013 | Keyaki et al. | |
| 2013/0240918 A1 | 9/2013 | Herrmann et al. | |
| 2013/0256710 A1 * | 10/2013 | Andrews ............. | H01L 25/0753 257/88 |
| 2013/0322068 A1 | 12/2013 | Clark et al. | |
| 2014/0047528 A1 * | 2/2014 | Schmidt ................ | H04L 63/061 726/7 |
| 2014/0104865 A1 | 4/2014 | Hutchins | |
| 2014/0374786 A1 * | 12/2014 | Bierhuizen ............. | B29C 43/18 257/98 |
| 2015/0192267 A1 * | 7/2015 | Goldstein ............. | F21V 7/0091 362/237 |

(56) References Cited

U.S. PATENT DOCUMENTS

2015/0252961 A1* 9/2015 Markytan ............... H01L 33/58
362/247

FOREIGN PATENT DOCUMENTS

| EP | 002114934-0002 | 10/2012 |
|---|---|---|
| EP | 2008316 | 3/2014 |
| JP | 1485299 | 11/2013 |

OTHER PUBLICATIONS

Non-Final Office Action for U.S. Appl. No. 13/441,620 dated Sep. 5, 2014.
Final Office Action for U.S. Appl. No. 13/796,045 dated Dec. 5, 2015.
Final Office Action for U.S. Appl. No. 13/441,620 dated Dec. 23, 2014.
Notice of Allowance for U.S. Appl. No. 13/796,045 dated Mar. 4, 2015.
Advisory Action for U.S. Appl. No. 13/796,045 dated Mar. 4, 2015.
Notice of Allowance for U.S. Appl. No. 13/441,620 dated Mar. 6, 2015.
Corrected Notice of Allowability for U.S. Appl. No. 13/441,620 dated May 7, 2015.
U.S. Appl. No. 13/424,699, filed Mar. 20, 2012.
Japanese Office Action for Application No. 2012-024518 dated Feb. 26, 2013.
Notice of Allowance for U.S. Appl. No. 13/441,620 dated May 21, 2015.
Notice of Allowance for U.S. Appl. No. 13/796,045 dated Jun. 11, 2015.
Chinese Office Action for Application No. 201230476421.3 dated Oct. 14, 2013.
Notice of Allowance for U.S. Appl. No. 29/417,704 dated Nov. 26, 2013.
Notice of Allowance for U.S. Appl. No. 29/433,842 dated Dec. 6, 2013.
Chinese Notice of Grant for Application No. 201230476421.3 dated Jan. 16, 2014.
Chinese Office Action for Application No. 201230476421.3 dated Jul. 18, 2013.
Japanese Invitation for Amendment for Application No. 2012-024518 dated Jul. 30, 2013.
Japanese Decision of Registration for Design Application No. 2012-024518 dated Sep. 24, 2013.
Restriction Requirement for U.S. Appl. No. 29/417,704 dated Oct. 2, 2013.
Restriction Requirement for U.S. Appl. No. 29/433,842 dated Oct. 2, 2013.
Restriction Requirement for U.S. Appl. No. 13/441,620 dated Mar. 4, 2014.
Restriction Requirement for U.S. Appl. No. 13/796,045 dated Apr. 14, 2014.

* cited by examiner

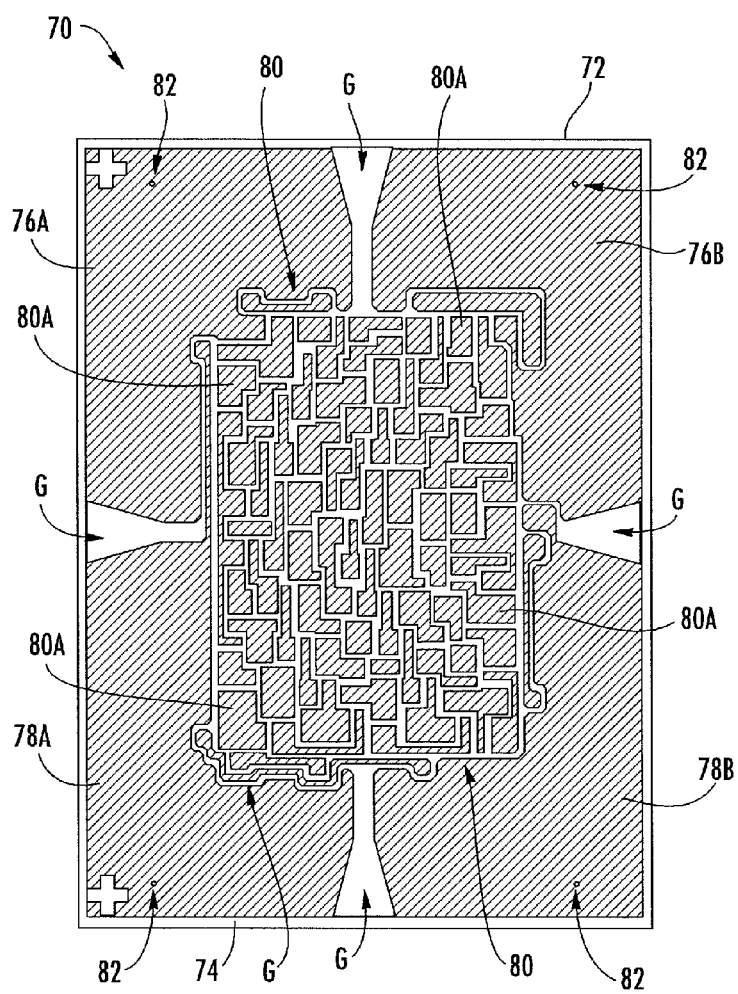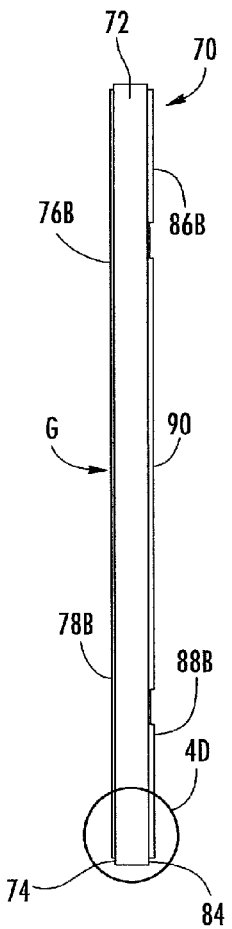
FIG. 4A
FIG. 4B

MULTI-CHIP LIGHT EMITTER PACKAGES AND RELATED METHODS

RELATED APPLICATIONS

This application claims priority to and is a continuation-in-part of co-pending U.S. patent application Ser. No. 13/441,620, filed on Apr. 6, 2012, which is a continuation-in-part of co-pending U.S. patent application Ser. No. 11/982,275, filed Oct. 31, 2007, and which is also a continuation-in-part of co-pending U.S. patent application Ser. No. 13/017,502, filed Jan. 31, 2011, which is based on Provisional Patent Application Ser. No. 61/384,623, filed Sep. 20, 2010 and which is also based on Provisional Patent Application Ser. No. 61/390,963, filed Oct. 7, 2010. The entire contents of each of these references are hereby incorporated by reference herein.

TECHNICAL FIELD

This present subject matter relates to packages for light emitters, such as light emitting diode (LED) chips. More particularly, the present subject matter relates to light emitter packages having multiple LED chips and related methods.

BACKGROUND

Light emitter chips, such as light emitting diode (LED) chips are solid state devices that can convert electric energy into light, and can generally comprise one or more active layers of semiconductor material sandwiched between oppositely doped layers. When a bias is applied across the doped layers, holes and electrons are injected into the active layer where they recombine to generate light. Light is emitted from the active layer and surfaces of the LED chip. LED chips can be packaged and used within various lighting products and/or lighting applications for provision of street and roadway lighting, parking lighting, indoor and outdoor lighting, portable lighting, etc.

Manufacturers of LED lighting products are constantly seeking ways to reduce their cost in order to provide a lower initial cost to customers, and encourage the adoption of LED products. Manufacturers are also constantly seeking ways to provide white light in a wider variety of applications, with greater energy efficiency, with improved color rendering index (CRI), with improved efficacy (1 m/W), and/or with longer duration of service.

Conventional LED lighting packages use primary lenses which are not optimized for light emission from multiple LED lighting sources, and therefore, have low CRI values. In addition, when viewed using conventional LED lighting, colored objects frequently fail to appear in a true color. That is, an object that reflects only yellow light, and thus that appears to be yellow when illuminated with white light, will appear dark almost black when illuminated with light having an apparent yellow color, produced by existing LED lighting products. Such products, therefore, are considered to provide poor color rendition, particularly when illuminating various settings, such as daytime and nighttime street lighting, outdoor lighting, or various indoor lighting.

Thus, despite the availability of various LED packages in the marketplace, a need remains for more cost-effective LED packages and/or methods which are efficient and have improved color rendition. Such packages and methods can also make it easier for end-users to justify switching to LED products from a return on investment or payback perspective.

SUMMARY

In accordance with this disclosure, multiple chip light emitter packages and related methods having improved performance are provided and described herein. For example, packages and methods described herein can advantageously exhibit improved color rendering, efficiency, power and/or ease of manufacture at a lower overall cost. In one aspect, packages and methods described herein offer cost-effective lighting solutions well suited for a variety of applications such as personal, industrial, and commercial lighting products and applications including, for example, street lighting (daytime and/or nighttime), indoor lighting, LED light bulbs, roadway, parking, and high end lighting fixtures, products and/or applications.

It is, therefore, an object of the present disclosure to provide light emitter packages and methods having improved performance, in one aspect, by using multiple LED chips that can emit different color points of light as well as incorporation of an asymmetrical lens. Notably, packages and methods described herein can exhibit an efficacy of at least approximately 100 lumens per watt (LPW) or more and a color temperature of approximately 4000 K when measured at 50 milliamps (mA). Light emitter packages and methods of the above-mentioned color temperature and efficacy can be operable at approximately 8 watts (W) or more. Packages described herein have improved color rendering, are brighter, and more efficient than conventional LED packages.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIGS. 4A to 4D are top, side, bottom, and sectional views of a light emitter package according to further aspects of the present subject matter;

DETAILED DESCRIPTION

Figure 1:
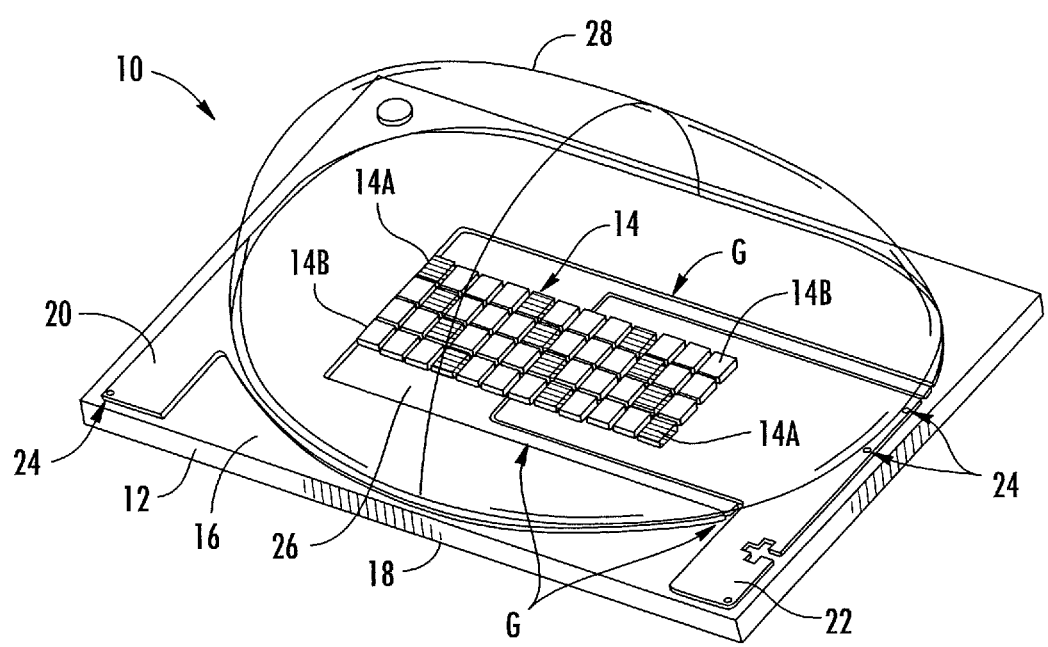
FIG. 1 is a top perspective view illustrating a light emitter package according to aspects of the present subject matter.

The subject matter disclosed herein is directed to light emitter packages and methods for use with light emitters, such as light emitting diodes (LEDs). Packages and methods described herein exhibit improved performance, for example, improved efficiency, color rendering, brightness, and/or light extraction at a lower cost than conventional packages. Packages described herein can utilize multiple LED chips. Notably, packages described herein utilize multiple light emitters and/or wavelength conversion material such as phosphors or lumiphors, adapted to emit light at different color points, the mixture or combination of which can yield what is perceived as "white" light. In some aspects, light emitter packages according to the subject matter herein are adapted to emit a light having a color temperature of approximately 4000 K. Notably, packages and methods described herein can exhibit an efficacy of at least approximately 100 lumens per watt (LPW) or more and a color temperature of approximately 4000 K when measured at 50 milliamps (mA). Light emitter packages and methods of the above-mentioned color temperature and efficacy can be operable at approximately 8 watts (W) or more.

In accordance with the present subject matter, it has unexpectedly been found that a surprisingly high CRI can be obtained while obtaining surprisingly high efficacy, by (i) illuminating multiple light emitters adapted to emit light having a dominant wavelength in a range from approximately 430 nm to approximately 480 nm (i.e., primarily blue light emitters), (ii) exciting one or more phosphors or lumiphors adapted to emit light having a dominant wavelength in a range from approximately 555 nm to approximately 585 nm (i.e., (i) and (ii) together can be deemed a "blue shifted yellow" or "BSY" light emitters) in combination with (iii) illuminating a plurality of light emitters adapted to emit light having a dominant wavelength in the range of approximately 600 nm to approximately 630 nm (i.e., primarily red, or red-orange (RDO) light emitters). Some aspects of color mixing for obtaining improved coloring rendering according to the present subject matter is described in commonly assigned U.S. Pat. No. 7,213,940, the disclosure of which is incorporated by reference herein in the entirety.

In some aspects according to the present subject matter, the mixture of light emitted by multiple light emitters, including at least some BSY light emitters and at least some RDO light emitters disposed within light emitter packages described herein can have a CRI of greater than approximately 70. In some aspects, the mixture of light from multiple light emitters, including at least some BSY light emitters and at least some RDO light emitters disposed within light emitter packages described herein can have a CRI of at least approximately 75, at least approximately 80, at least approximately 85, at least approximately 85, at least approximately 90, or greater than approximately 90.

In some aspects, light emitter packages according to the present subject matter can have an efficacy of at least approximately 80 lumens per watt (LPW). In some aspects, light emitter packages according to the subject matter herein can have an efficacy of at least approximately 90 LPW, at least approximately 95 LPW, at least approximately 100 LPW, at least approximately 125 lumens per watt, at least approximately 140 LPW, at least approximately 150 LPW, or in some aspects more than approximately 150 LPW. Such efficacy results described herein can be attained when measured at approximately 65 degrees Celsius (° C.) and 50 milliamps (mA).

In some aspects, light emitter packages according to the present subject matter can have an overall luminous flux of at least approximately 1000 lumens (lms) or more. In some aspects, light emitter packages according to the present subject matter can have an overall luminous flux of at least approximately 1110 lms, at least approximately 1150 lms, at least approximately 1200 lms, or in some aspects more than approximately 1200 lms. Such luminous flux values described herein can be attained when measured at approximately 65° C. and at 50 mA and/or an input power of approximately 10 watts (W).

In some aspects, light emitter packages according to the subject matter herein at the above the efficacy and luminous flux ranges or sub ranges can operate at a power of at least approximately 8 watts (W), at least approximately 9 W, at least approximately 10 W, at least approximately 10.5 W, at least approximately 11 W, at least approximately 12 W, or more than approximately 12 W.

In some aspects, light emitter packages according to the subject matter herein can have a reference point on the blackbody locus a color temperature of approximately 4000 K. In other aspects, such a reference point on the blackbody locus may have a color temperature of less than or approximately equal to 7000 K, less than or approximately 5000 K, less than or approximately equal to 4000 K, less than or approximately equal to 3500 K, less than or approximately equal to 3000 K, and/or less than or approximately equal to 2700 K.

In some aspects, the mixture of light emitted by multiple differently colored LED chips within light emitter packages according to the subject matter herein can have x, y coordinates on a 1931 CIE Chromaticity Diagram which define a point that is within ten MacAdam ellipses, or in some cases within five or within three MacAdam ellipses, of at least one point on the blackbody locus on a 1931 CIE Chromaticity Diagram.

In some aspects, the number of BSY and/or RDO chips (i.e., the chip count), the percentage of light emitted by the BSY and/or RDO chips within the package, the trace design, the control scheme, and/or the drive current can each be individually varied and/or combinations thereof can be varied to conform to desired performance metrics (e.g., luminous flux, Vf, LPW, etc.) and to target low and high scotopic/photopic (S/P) ratios.

Daytime and nighttime sensitivity functions are referred to as photopic (P), (e.g., daytime light levels) and scotopic (S), (e.g., nighttime light levels) responses. The S/P ratio, in some aspects can be raised or lowered depending upon the number or percentage of BSY and/or RDO chips per package. For example, in some aspects, increasing a percentage of light emitted by RDO chips per package, for example, to about 20% or more, can increase the S/P ratio above 2 (i.e., S/P>2), which can be better for nighttime illumination. This may be desired for roadway lighting, parking or street lighting applications. In some aspects, decreasing the percentage of light emitted by RDO chips within a light emitter package, for example, to about 10% or less, can decrease the S/P ratio below two (i.e., S/P<2), which can be better for daytime illumination.

In some aspects, light emitter packages described herein can implement a control scheme where each string of similarly colored LED chips can be individually controlled and/or mutually exclusive. For example, light emitter packages described herein can comprise different colored LED chips, such as BSY LED chips used in combination with RDO LED chips. In some aspects, the BSY LED chips can be serially connected in a first single string that is mutually exclusive from a second string of serially connected RDO LED chips.

In some aspects, the first BSY string and the second RDO can be individually controlled and/or electrically communicate with different pairs of electrical traces comprising an anode/cathode pair. Any other control scheme is contemplated herein, for example, individual control over multiple strings is contemplated. For example, control schemes describing more than one individually controllable LED chip and/or string of LED chips are described in commonly assigned applications including, for example: U.S. Pat. No. 8,337,214; U.S. Pat. No. 7,549,786; U.S. patent application Ser. No. 12/335,631; U.S. patent application Ser. No. 12/566,142; U.S. patent application Ser. No. 12/574,918; and U.S. patent application Ser. No. 12/579,946, each of which is incorporated by reference herein in the entirety.

In some aspects, the BSY and RDO chips can be arranged in at least one non-repetitive and/or asymmetric arrangement or pattern within an LED populated area (e.g., at least one non-repeating row or column of BSY and RDO chips). In other aspects, the BSY and RDO chips can be arranged in repetitive and/or symmetrical arrangements or patterns within an LED populated area (e.g., at least one repeating row or column of BSY and RDO chips). The LED populated area refers to an area on the submount, the outer boundaries of which can comprise the outermost edges of the outermost LED chips (of an LED chip array) in any direction.

An example of selecting chips from various color bins to produce desired color characteristics is described in commonly assigned U.S. patent application Ser. No. 12/425,855, which is entirely incorporated herein by reference. A detailed example of using groups of LED chips emitting light of different wavelengths to produce substantially white light can also be found in commonly assigned U.S. Pat. No. 7,213,940 which is entirely incorporated herein by reference.

In some aspects, an array of LED chips can be arranged over a substrate or submount in a chip on board (COB) structure. COB structures are described in, for example, U.S. Pat. No. 7,821,023 to Yuan et al., which issued on Oct. 26, 2010, and U.S. Patent Application no. 2009/0108281 to Keller et al., published on Apr. 30, 2009, both of which are commonly assigned and hereby incorporated by reference in their entireties.

In some aspects, light emitter packages described herein can comprise a non-metallic or ceramic based substrate or submount. As used herein a "ceramic based material" or the term "ceramic based" comprises a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

In some aspects, light emitter package s according to the present subject matter can be configured to refract LED chip emitted light toward a preferential direction. For example, the LED chip array can define an emitter axis, and the lens can have an outer surface and a centerline which can be offset from the emitter axis toward the preferential direction. Further, the lens can be shaped for refraction of LED chip emitted light toward the preferential direction. In some aspects, the light emitter package can comprise an asymmetric overmolded lens.

As used herein with respect to optical elements and/or lenses, the term "asymmetric", when unmodified by any further limiting description, refers to a lens shape which is not rotationally symmetric about any axis perpendicular to its base plane. Types of asymmetric lenses can comprise, without limitation, bilaterally symmetric lenses.

As used herein a "dominant wavelength" refers to the perceived color of a spectrum, i.e., the single wavelength of light which produces a color sensation most similar to the color sensation perceived from viewing light emitted by the light source (i.e., it is roughly akin to "hue"), as opposed to "peak wavelength", which is well-known to refer to the spectral line with the greatest power in the spectral power distribution of the light source. Because the human eye does not perceive all wavelengths equally (it perceives yellow and green better than red and blue), and because the light emitted by many solid state light emitter (e.g., LEDs) is actually a range of wavelengths, the color perceived (i.e., the dominant wavelength) is not necessarily equal to (and often differs from) the wavelength with the highest power (peak wavelength). A truly monochromatic light such as a laser has the same dominant and peak wavelengths.

As used herein, the term "epi area" refers an active area or active region of an LED chip, such as the area of the LED chip which emits light. In some aspects, the active area or active region of an LED chip comprises the p-n junction area and the surface or area which emits light from the LED chip. "Epi" is short for epitaxial layers and/or epitaxy which refer to the manufacturing process for providing active areas, layers, or regions within LED chips.

As used herein, the terms "LED populated area", "LED chip populated area", "source size", or variations thereof, refer to an on the submount, the outer boundaries of which can comprise the outermost edges of the outermost LED chips (of an LED chip array) in any direction. As used herein, the term "aspect ratio" refers to the ratio of the maximum cross-dimension of the LED chip populated area to the maximum of the cross-dimensions orthogonal thereto.

In some aspects, packages and methods described herein relate to providing an overmolded lens, which can directly touch LED chips and/or the package submount. In some aspects, the lens can be asymmetric. In some aspects, the lens can comprise an "efficacy zone" or "primary lens efficacy zone" which refers to the "sweet spot" of the lens having maximum primary lens efficacy. In some aspects, packages described herein maximize or pack as much epi area (e.g., active chip area) within the efficacy zone to increase lens efficacy. The efficacy zone for packages described herein can comprise an area of approximately 10 $mm^2$ or more. An epi area of at least 4.3 $mm^2$ or more, $^{such\ as}$ at least 5.4 $mm^2$ or more, or at least 7.73 $mm^2$ or more can be provided within the primary lens efficacy zone. Packages described herein can for example comprise an LED populated zone of approximately 26 $mm^2$ or more.

The packages disclosed herein can define an LED chip populated area or source size on the submount. In some embodiments, the LED chip populated area can have an aspect ratio greater than 1. In some of these embodiments, the aspect ratio can be at least 2, and in some, the aspect ratio can be about 2.5 or greater.

As used herein, the term "emitter axis" refers to the line orthogonal to the plane defined by the LED chip populated area and passing through the geometric center of the minimum-area rectangle bounding the LED chip populated area, i.e., the center of the rectangle of minimum area which comprises all of the LED chip populated area.

The terms "conductive pad(s)", "electrical trace(s)", "electrically conductive trace(s)", "conductive portions", or "portions of conductive material" can be used interchangeably to refer to those portions of a light emitter package which are electrically conductive and can be configured to collectively pass electrical current into and out of one or more light emitters, such as one or more LED chips.

The light emitters used in packages according to the present subject matter and/or the phosphor (or phosphors) and/or lumiphor (or lumiphors) used in packages according to the present subject matter, can be selected from among any solid state light emitters and lumiphors known to persons of skill in the art. Wide varieties of such solid state light emitters and lumiphors are readily obtainable and well known to those of skilled in the art, and any of them can be employed. For example, solid state light emitters and lumiphors which may be used in practicing the present subject matter are described in scientific literature as well as in a number of commonly assigned U.S. patents, including but not limited to U.S. Pat. No. Re. 34,861, U.S. Pat. No. 4,946,547, U.S. Pat. No. 5,200,022, and U.S. patent application Ser. No. 11/899,790, the disclosure of each of which is incorporated by reference herein in the entirety.

Examples of types of such solid state light emitters comprise inorganic light emitting diodes and organic light emitting diodes, a variety of each of which are well-known in the art. In some aspects, light emitter or LED packages according to embodiments described herein can comprise group III-V nitride (e.g., gallium nitride (GaN)) based LED chips or lasers. In some aspects, LED chips or lasers can be fabricated on a growth substrate, for example, a silicon carbide (SiC) substrate, such as those chips or devices manufactured and sold by Cree, Inc. of Durham, N.C. Other growth substrates are also contemplated herein, for example and not limited to sapphire, silicon (Si), and GaN.

Although various embodiments of LED chips used in connection with packages described herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

In some aspects, light emitter packages and related methods according to the present subject matter can comprise one or more wavelength conversion materials, or luminescent materials. For example, the one or more luminescent materials can be selected from phosphors, scintillators, day glow tapes, inks which glow in the visible spectrum upon illumination with ultraviolet light, etc. The one or more luminescent materials can be provided in any desired form. For example, the luminescent element can be embedded in a resin (i.e., a polymeric matrix), such as a silicone material or an epoxy.

The one or more lumiphors can, if desired, further comprise (or consist essentially of, or consist of) one or more highly transmissive (e.g., transparent or substantially transparent, or somewhat diffuse) binder, e.g., made of epoxy, silicone, glass or any other suitable material (for example, in any given lumiphor comprising one or more binder, one or more phosphor can be dispersed within the one or more binder). The one or more lumiphors can, independently, further comprise any of a number of well-known additives, e.g., diffusers, scatterers, tints, etc.

Luminescent materials, such as phosphor, can be applied during wafer fabrication (e.g., prior to singulation of LED chips from the wafer) and, therefore, prior to die attach within an LED package. In other aspects, luminescent materials can be selectively applied to a portion of the LED chips after die attach within an LED package. That is, in some aspects, a stencil or mask can be used to mask RDO chips and expose BSY chips. The BSY chips can then be selectively coated with one or more phosphors or lumiphors, and the RDO chips will remain non-coated.

LED chips can be coated with a phosphor using many different methods, with one suitable method being described in U.S. patent application Ser. No. 11/656,759; U.S. patent application Ser. No. 11/899,790; and U.S. patent application Ser. No. 11/899,790, the disclosure of each of which is incorporated herein by reference in the entirety. Other suitable methods for coating one or more LED chips are described in U.S. Pat. No. 8,058,088 and the continuation-in-part application U.S. patent application Ser. No. 12/717,048, the disclosures of which are hereby incorporated by reference herein in their entireties. LED chips can also be coated using other methods such as electrophoretic deposition (EPD), with a suitable EPD method described in U.S. patent application Ser. No. 11/473,089, which is also incorporated herein by reference in its entirety.

As illustrated in the various figures, some sizes of structures or portions may be exaggerated relative to other structures or portions for illustrative purposes and, thus, are provided to illustrate the general structures of the present subject matter and may or may not be drawn to scale. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the package or component in addition to the orientation depicted in the figures. For example, if the package or component in the figures is turned over, structure or portion described as "above" other structures or portions would now be oriented "below" the other structures or portions. Likewise, if the package or component in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

Referring now to FIGS. 1 to 9B, various aspects of light emitter packages and related methods are illustrated. Light emitter packages shown and described herein comprise multiple solid state light emitters, such as multiple LED chips. Notably, light emitter packages described herein can comprise multiple LED chips, where a first portion (e.g., a first percentage or a first string) of the chips can emit light of a first dominant wavelength and a second portion of the chips can emit light of a second dominant wavelength that is different from the first dominant wavelength. Collectively, the differently colored LED chips, in combination with a luminescent material such as phosphor, can emit white light that is approximately 4000 K and has a high CRI that is greater than 70. For example, light emitter packages and related methods described herein can comprise differently colored LED chips and one or more phosphoric materials which can emit light that, upon mixing, is perceived as white light of approximately 4000 K and approximately 75 CRI, approximately 80 CRI, approximately 85 CRI or more than approximately 85 CRI.

FIG. 1 is a top perspective view of light emitter package, generally designated 10. Light emitter package 10 can comprise a substrate or submount 12 based package and multiple light emitters disposed over submount 12. In one aspect, the multiple light emitters can comprise multiple LED chips, generally designated 14, mounted over submount 12. LED chips 14 can emit a same color of light or different colors of light. For example, some LED chips 14A that are shaded in appearance can emit a first color of light having a different dominant wavelength than other LED chips 14B which are not shaded in appearance and which can emit a second, different color of light. In some aspects, some LED chips 14A can also be coated or layered with a phosphor adapted to emit a third color of light, of a different third dominant wavelength. The mixture of light from LED chips 14A, 14B, and the phosphor can mix to emit white light. In other aspects, LED chips 14A and 14B can comprise a combination of one or more blue, BSY, red, green, yellow, cyan, red-orange, RDO and/or amber chips used alone and/or with any combination of red, blue, yellow, and/or green phosphor materials. Although not shown, in some aspects, each LED chip 14 can also each emit a same or similar color of a same or similar dominant wavelength.

In some aspects, LED chip 14 can comprise many different semiconductor layers arranged in any suitable structure. In some aspects, the LED chips 14 can comprise vertically structured chips (e.g., electrical contacts/bond pads on opposing sides/surfaces) or horizontally structured chips (e.g., electrical contacts or bond pads on a same side/surface). Vertically and/or horizontally structured chips can be configured to attach to electrical components (e.g., electrically conductive traces or pads) within package 10 either directly or via one or more wire bonds (e.g., FIG. 9B). LED chips 14 can be attached via epoxy, silicone, paste, solder, flux, eutectic materials, or any combination thereof.

Submount 12 can be formed of many different materials. In some aspects, submount 12 can comprise a material having a high thermal resistance, a low thermal conductivity, and/or be electrically insulating. Suitable materials can comprise, but are not limited to non-metallic, ceramic based, and/or organic materials such as alumina or aluminum oxide ($Al_2O_3$), aluminum nitride (AlN), zirconia or zirconium dioxide ($ZrO_2$), polyimide (PI), polyphthalamide (PPA), plastic, a thermoplastic, combinations thereof, or any other suitable material having a high thermal resistance. In other embodiments, submount 12 can comprise a portion of printed circuit board (PCB), a metal core printed circuit board (MCPCB), a flexible circuit, sapphire, silicon, silicon carbide (SiC), or any other suitable material, such as T-Clad thermal clad insulated substrate material, available from The Bergquist Company of Chanhassen, Minn. For PCB embodiments different PCB types can be used such as standard FR-4 PCB, MCPCB, or any other type of printed circuit board.

In some aspects, LED packages according to the present subject matter can be fabricated using a method which utilizes singulating individual submounts and/or packages built thereon from a larger submount panel sized to accommodate a plurality of submounts 12. In some aspects, multiple LEDs can be mounted or die attached to the panel prior to singulation into individual submount based packages, and each individual package can be singulated from the panel prior to or after encapsulation, molding, or otherwise forming an optical element, such as a lens 28, described for example in detail with respect to FIGS. 3A to 3C.

Submount 12 can have a top surface 16 and a bottom surface 18 opposing the top surface. Top and bottom surfaces 16 and 18 can comprise electrically conductive features which can electrically communicate using one or more through-holes or vias 24 which can be filled or a plated with an electrically conductive material. In some aspects, top surface 16 of submount can comprise electrically conductive features such as a first electrically conductive trace 20 and a second electrically conductive trace 22. At least one, or in some aspects multiple intermediate traces or pads can be disposed between first conductive trace 20 and second conductive trace 22. For example, in some aspects, a third electrically conductive trace 26 can be disposed therebetween. As shown, portions of first and second traces 20 and 22 can comprise markings and/or notches used for alignment and/or identification of electrical polarity (e.g., "+" or "−" signs).

In some aspects, one or more trenches or gaps G can be provided between respective electrical traces to electrically and physically separate each trace from adjacent traces. In some aspects, first and second electrical traces 20 and 22, respectively, can comprise opposing electrical polarities adapted to pass electrical current into the multiple LED chips 14 causing illumination thereof. In some aspects, first and second electrical traces 20 and 22 comprise an anode/cathode pair adapted to receive electrical signal or current from an external source. The external source (not shown) can pass current into bottom contacts (e.g., FIG. 2C), which in turn pass current into first and second traces 20 and 22 using vias 24. Electrical current can be passed between first and second traces 20 and 22 using one or more intermediate traces, such as third trace 26.

In some aspects, the multiple LED chips 14 can be mounted proximate the center of submount 12, and can be disposed over portions of first, second, and/or third traces 20, 22, and 26, respectively. In some aspects, LED chips 14 may only be disposed over portions of second and third traces 22 and 26, respectively, and electrically connected to first trace 20 via wirebonds (not shown). LED chips 14 can be physically arranged and electrically connected to traces in any desired connectivity scheme between first and second traces 20 and 22, respectively.

In some aspects, each conductive feature disposed on submount 12, such as traces, can be patterned over submount 12 via physical deposition, chemical deposition, electroplating techniques, electroless plating techniques, sputtering, or any other layering, depositing, or coating method and materials as described below with respect to FIG. 2D. In some aspects, gaps G can be formed via physical or chemical removal methods after plating a large trace area. For example and in some aspects, gaps G can be etched after electroplating a large trace area. In other aspects, gaps G formed by using a mask during deposition of traces, such that the mask prevents material from depositing into unwanted regions, such as gaps G. In some aspects, gaps G can extend down to top surface 16 of the submount 12 for electrically separating or isolating portions of first, second, and intermediate third traces 20, 22, and 26. As discussed further herein, a reflective material, such as a solder mask or other reflective material can be provided in portions of the trenches or gaps G disposed between traces to increase reflectivity of light, and improve package brightness and efficiency.

Figure 2A:
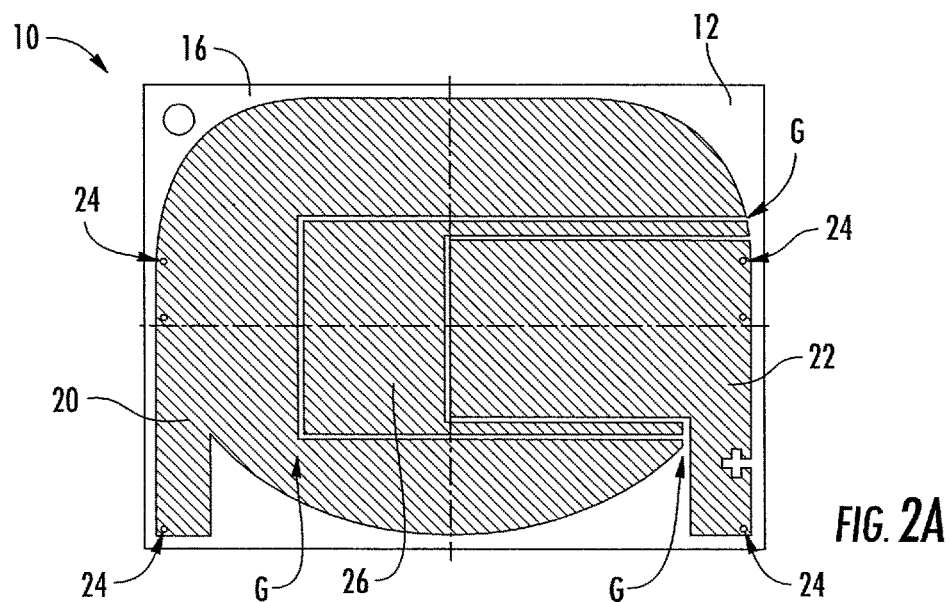
FIGS. 2A to 2D are top plan, side, bottom, and sectional views illustrating a light emitter package according to further aspects of present subject matter.
Figure 7A:
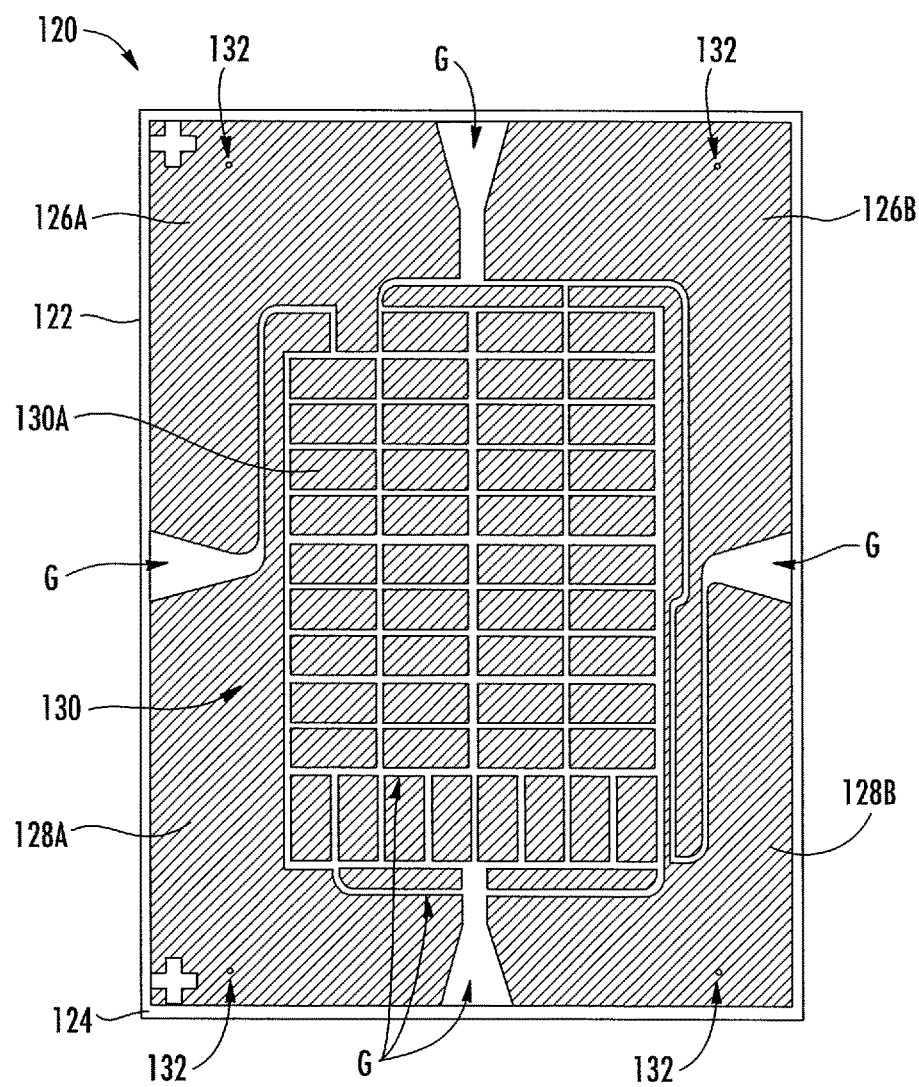
FIGS. 7A and 7B are top and bottom views illustrating a light emitter package according to further aspects of the present subject matter.

FIGS. 2A to 2D illustrate various aspects associated with submount 12 of package 10. FIG. 2A more clearly illustrates the patterns of first trace 20, second trace 22, and third trace 26, which is an intermediate trace disposed therebetween. The traces are shaded or hatched in visual appearance such that they can clearly be seen separated and/or spaced apart via trenches or gaps G. The geometric configuration of the first, second, and third traces 20, 22, and 26 respectively, can be arranged such that an array of LED chips 14 (FIG. 1) can be conveniently laid out in a substantially rectangular pattern such as shown in FIGS. 1, 4A, and 7A. In other aspects, LED chips 14 can be laid out in a non-rectangular pattern, such as an oval, ellipse, or truncated ellipse. In fact, any geometry that substantially follows a lens outline can be provided and is contemplated herein. Numerous other patterns are possible as are numerous other geometric configurations of the traces. Such other configurations and patterns are not limited by the embodiments shown.

Figure 2B:
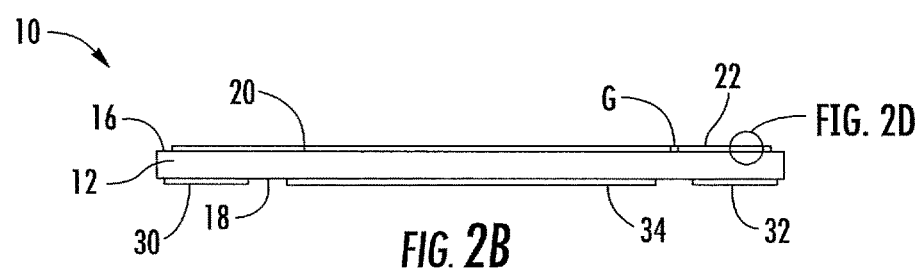

FIG. 2B illustrates a side view of submount 12. As noted earlier, submount 12 can comprise top surface 16, bottom surface 18, and electrically conductive features disposed on each of the top and bottom surfaces. In some aspects, electrically conductive features disposed on top surface 16 can comprise first, second, and third traces 22, 24, and 26, respectively. Electrically conductive features disposed on bottom surface 18 can comprise first contact 30 and second contact 32. In some aspects, first and second contacts 30 and 32 can comprise surface mount pads adapted for electrically connecting and mounting over an external power source or circuit (e.g., a PCB, flex circuit, MCPCB, etc.) That is, packages described herein can be adapted for surface mount technologies and/or comprise a surface mount device, typically referred to as an SMD.

In some aspects, first contact 30 and first trace 20 can electrically communicate using by passing electrical current along one or more internal vias 24 (FIGS. 2B and 2C) which can be filled or plated with electrically conductive material. Similarly, second contact 32 and second trace 22 can electrically communicate by passing electrical current along one or more vias 24 which can be filled or plated with electrically conductive material. Vias 24 can comprise conduits for electrical current, and can be disposed inside and/or internally within portions of submount 12, the endings or openings of which can be visible from the outside of the package as shown in the Figures.

Figure 2C:
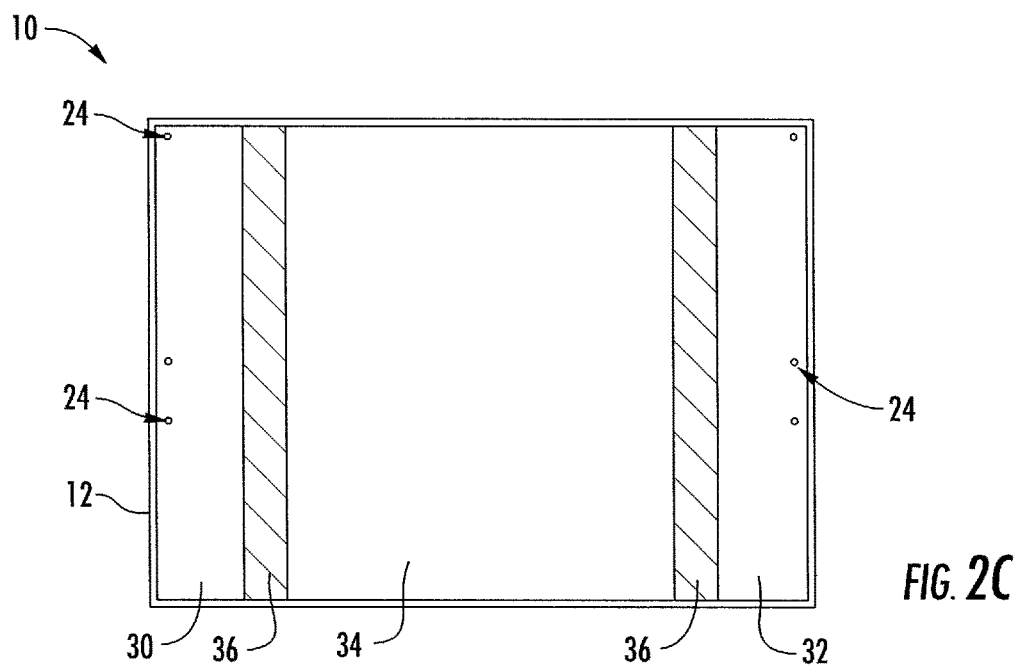

Referring to FIG. 2C and in some aspects, electrical signal can be applied to package 10 from an external circuit or power source (not shown) by applying electrical current to one or more surface mount pads, such as first and second contacts 30 and 32. First contact 30 can at least partially align with portions of first trace 20 and second contact 32 can at least partially align with portions of second trace 22. Electrically conductive thru-holes or vias 24 can be disposed internally within portions of submount 12 such as between portions of first trace 20 and first contact 30 and between portions of second trace 22 and second contact 32 such that electrical signal can be communicated therebetween. First and second contacts 30 and 32 can allow for surface mounting of LED package 10 such that electrical signal applied across first and second contacts 30 and 32 can pass into and illuminate LED chips 14 by electrical communication between contacts and traces, where the electrical communication can be facilitated by vias 24. Vias 24 can comprise any suitable material(s) deposited and/or plated using different techniques. In some aspects, vias 24 can comprise a Ag or Ag-alloy deposited or plated during fabrication of a large submount panel. Vias 24 can be formed by punching, drilling, etching, scribing, or otherwise forming holes within a green ceramic tape such that the vias penetrate internally and extend within a portion of the panel. In further aspects, vias 24 can be formed by laser drilling an already fired HTCC panel.

It is understood that first and second contacts 30 and 32, as well as vias 24 and multiple traces (e.g., 20, 22) can be arranged in many different ways and can have many different shapes and/or sizes upon submount 12. It is also understood that instead of vias, one or more electrically conductive traces can be provided along internal and/or external surfaces of submount 12 between portions of first trace 20 and first contact 30 and between portions of second trace 22 and second contact 32.

To improve heat dissipation within LED package 10, traces can provide thermally conductive paths extending laterally for conducting heat away from LED chips 14 such that it can spread to other areas of the submount beyond the areas just below LED chips 14. In addition, LED package 10 can further comprise a metallized area 34 on bottom surface 18 of submount 12. Metallized area 34 can comprise a localized heat sink which can transfer heat from below LED chips 14 into an external heat sink (not shown), for example, over a PCB or circuit. Metallized area 34 can comprise a thermally conductive material and can be at least partially vertically aligned below LED chips 14. In one embodiment, metallized area 34 is not in electrical contact with any of the elements on top surface 16 of submount 12 and/or first and second contacts 30 and 32 on the bottom surface 18 of submount 12. Although heat from the LED chips 14 can laterally spread over the top surface 16 of submount 12 via traces, more heat can pass into submount 12 directly below and around LED chips 14. Metallized area 34 can assist with and improve heat dissipation by allowing heat to spread into the metallized area where it can dissipate more readily and can be passed into an external heat sink (not shown). In some aspects, metallized area 34 can be at least substantially the same thickness as first and second contacts 30 and 32, respectively. In other aspects, metallized area 34 can be either thicker or thinner than one or both of first and second contacts 30 and 32. One or more insulating portions of material 36 can be disposed between metallized area 34 and first and second contacts 30 and 32. In some aspects, insulating portions of material 36 comprise a solder mask, which can be any color, such as green.

Figure 2D:
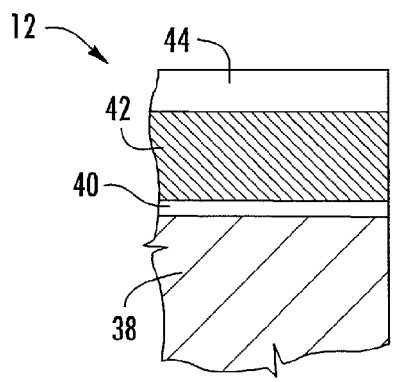

FIG. 2D is a detailed view of the upper right corner of submount 12 of package 10. That is, FIG. 22 illustrates metallic layers of which one or more of first, second, and third traces 20, 22, and 26, respectively can be comprised. Submount 12 can comprise a ceramic based material 38. In some aspects, material 38 can comprise $Al_2O_3$ or AlN. However, any non-metal is contemplated. A first layer 40 of material can be deposited over material 38 of submount 12, and can comprise a layer of titanium (Ti). First layer 40 is optional. A second layer 42 of material can be disposed directly over first layer 40 or directly over base material 38. In some aspects, second layer 42 can comprise a layer of copper (Cu). An optional third layer 44 can be deposited over a portion of the Cu layer. Third layer 44 can comprise a reflective material such as silver (Ag), solder mask, or a layer comprised of reflective particles. Any reflective material can be used. In one aspect, more than three layers can be applied. For example, in some aspects an electroless gold immersion nickel (ENIG) layer can be applied over the Cu for improving the wirebondability thereof. Please note that such layers may not be shown in their proper relative thicknesses. In some aspects, the ceramic based material 38 can for example comprise a thickness averaging approximately 0.50 mm. First layer 40 can comprise a thickness averaging approximately 0.06 microns. Second layer 42 can comprise a thickness averaging approximately 50 microns. Where used, third layer 44 can comprise a thickness averaging approximately 3.5 microns.

Figure 2E:
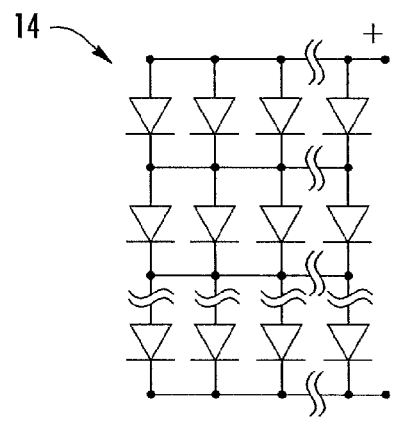
FIG. 2E is a schematic circuit diagram illustrating the electrical connectivity of the LED chips according to one aspect of the present subject matter.

FIG. 2E is a simple circuit diagram schematically illustrating the electrical connectivity of LED chips 14 within package 10. As noted earlier, any number of chips 14 can be disposed in package 10 on submount 12. In some aspects, at least two, and even more than two groups of serially connected LED chips 14 can be provided. In some aspects, each group can be wired in parallel. Positive contact (+) can be connected to a positive terminal of a driver circuit (not shown) and negative contact pad (−) can be connected to the negative terminal of such driver circuit. One or more intermediate traces, such as third trace 26 (FIG. 2A), can form common connection points for the LED chips 14. Other serial/parallel configurations can also be provided and are contemplated.

Light emitter packages described herein can further comprise an optical element or lens. Both the term "optical element" and the term "lens" as used in this disclosure are intended in a broadest sense. Such an element may affect light by bending, reflecting, diffracting, scattering, and/or concentrating light rays, by color mixing, or by a combination of such effects. A lens for use with LED packages described herein can comprise glass or plastic, may be molded in place or elsewhere, or otherwise formed or attached to the package as desired. For example, the lens may be overmolded using a liquid curable silicone material. As described herein, lenses can provide both environmental and/or mechanical protection. Lenses can comprise an apex (e.g., a point of maximum height) which can be substantially centered or non-centered with respect to portions of submount and/or LED chips. In some aspects, lenses described herein can be formed in direct contact with LED chips and a top surface of submount. In other embodiments there may be an intervening material or layer disposed between LED chips and/or top surface of submount. Direct contact of the lens to the LED chips may provide certain advantages, such as improved light extraction and ease of fabrication. Lenses of various sizes and shapes may be used in combination with LED chips of various sizes, shapes, count, and/or color.

Figure 3A:
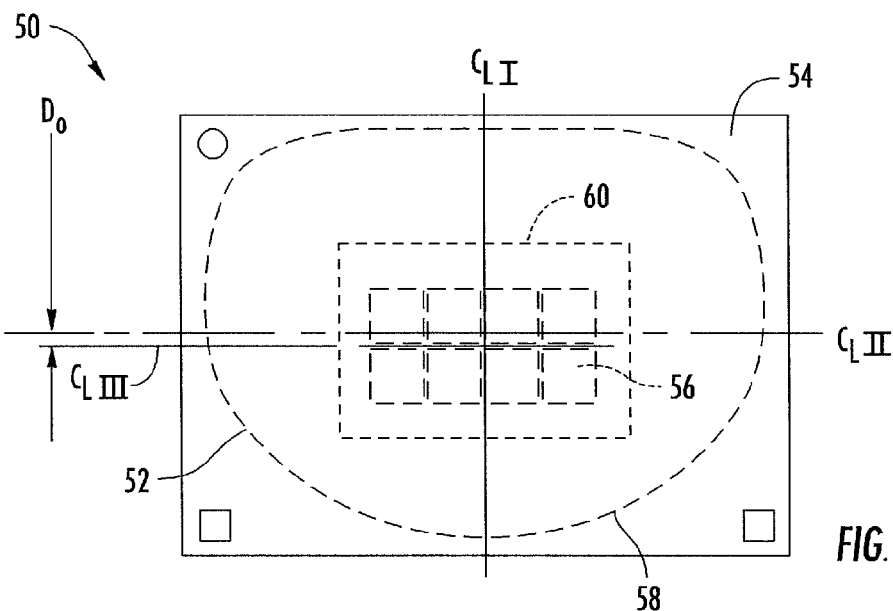
FIGS. 3A to 3C are top and side views illustrating a light emitter package having an optical element according to further aspects of the present subject matter.
Figure 3B:
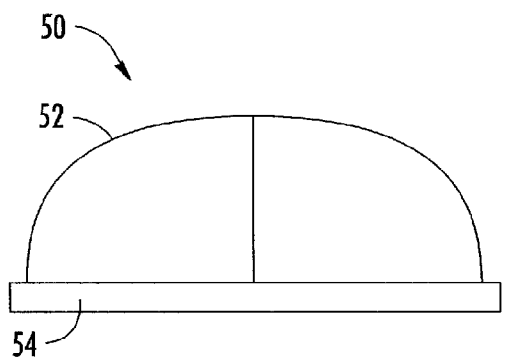
Figure 3C:
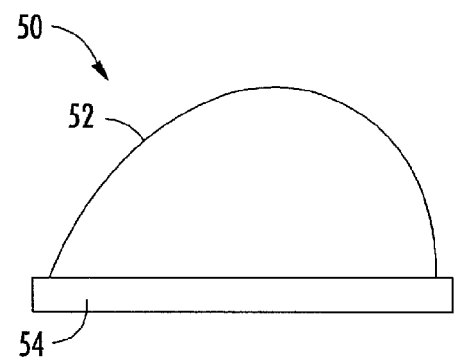

Referring now to FIGS. 3A to 3C and notably, light emitter packages provided herein can comprise an asymmetrically shaped lens. FIGS. 3A to 3C illustrate a light emitter package, generally designated 50, which schematically illustrates a lens 52 according to the present disclosure, disposed over a submount 54. One or more light emitters 56 can be provided over and supported by submount 54. Light emitters 56, such as LED chips, are illustrated in broken lines as the chip count, color, size, and/or placement of LED chips can vary per package design. In addition and some aspects, LED chips may not be visible from outside the package, as they may be coated with a wavelength conversion material, such as phosphor.

In some aspects, light emitted by LED package 50 can be directed towards a preferential side or in a preferential direction. For example, such preferential side lighting is best illustrated in FIGS. 3A and 3C. Package 50 can comprise an asymmetrical, asymmetric, and/or asymmetrically shaped lens 52. An apex (e.g., point of maximum height) can be substantially flat and/or parallel to an upper surface of submount 54. As FIG. 3B illustrates, the apex can be substantially centered over submount 54 in one direction, and as FIG. 3B illustrates, the apex can be non-centered with respect to submount 54 when viewed in another direction.

In FIG. 3A, a direction of preferential-side illumination is toward the top of the figure. In FIG. 3C, a direction of preferential-side illumination is to the right of the figure. In some aspects, lens 50 can comprise a primary lens efficacy zone, the boundary of which is labeled 60. Primary lens efficacy zone 60 can comprise a "sweet spot" of the primary lens 52, which can correspond to an area from which the lens 52 is most effective at emitting light. As discussed further below with respect to FIGS. 9A and 9B, increasing an amount of active area (e.g. epitaxial area or "epi" are) per LED chip within primary lens efficacy zone 60 can achieve a maximum primary lens efficacy.

Preferential side illumination can also be achieved by the relative position of the array of light emitters 56 and lens 52. FIG. 3A is a front (top) view of package 50. As FIG. 3A illustrates, lens 52 can comprise a first lens centerline $C_{LI}$ in a first direction, and a second lens centerline $C_{LII}$ in a second direction. The array of light emitters 52 can comprise a third centerline $C_{LIII}$ (i.e., also referred to as an emitter axis) in the second direction. The second lens centerline $C_{LII}$ can be offset from the third centerline $C_{LII}$ of the array of light emitters by an offset distance $D_O$. Increasing the distance offset direction $D_O$, such that the array of light emitters is pushed towards the curved portion of the lens base 58 (e.g., towards the bottom of base 58 in FIG. 3A) can improve efficiency of the primary lens 52.

In some aspects, lens base 58 can comprise a non-circular base. In some aspects, lens 52 can comprise a substantially kidney bean shape that may be asymmetric about one or more axes. The kidney bean shape can for example comprise three substantially curved edges and one substantially straight edge (e.g., towards the top of FIG. 3A) with respect to the edges of submount 52. Offset distance $D_O$ can be on the order of approximately 0.24 mm or more for light emitter array dimensions of approximately 4.2 mm×6.2 mm over submount 52 having dimensions of approximately 8 mm by 11 mm (e.g., in some aspects 8.22×11.25 mm). Numerous other dimensional offsets and measurements are possible and contemplated herein.

Notably, asymmetric lens 52 can be provided and/or overmolded on a portion of submount 52 and can be disposed over at least portions of the array of light emitters 56. The lens arrangement of LED package 50 can also be adapted for use with secondary lenses or optics that can be included over lens 52 by an end user to facilitate beam shaping. Such secondary lenses are generally known in the art, with many of them being commercially available.

Figure 4C:
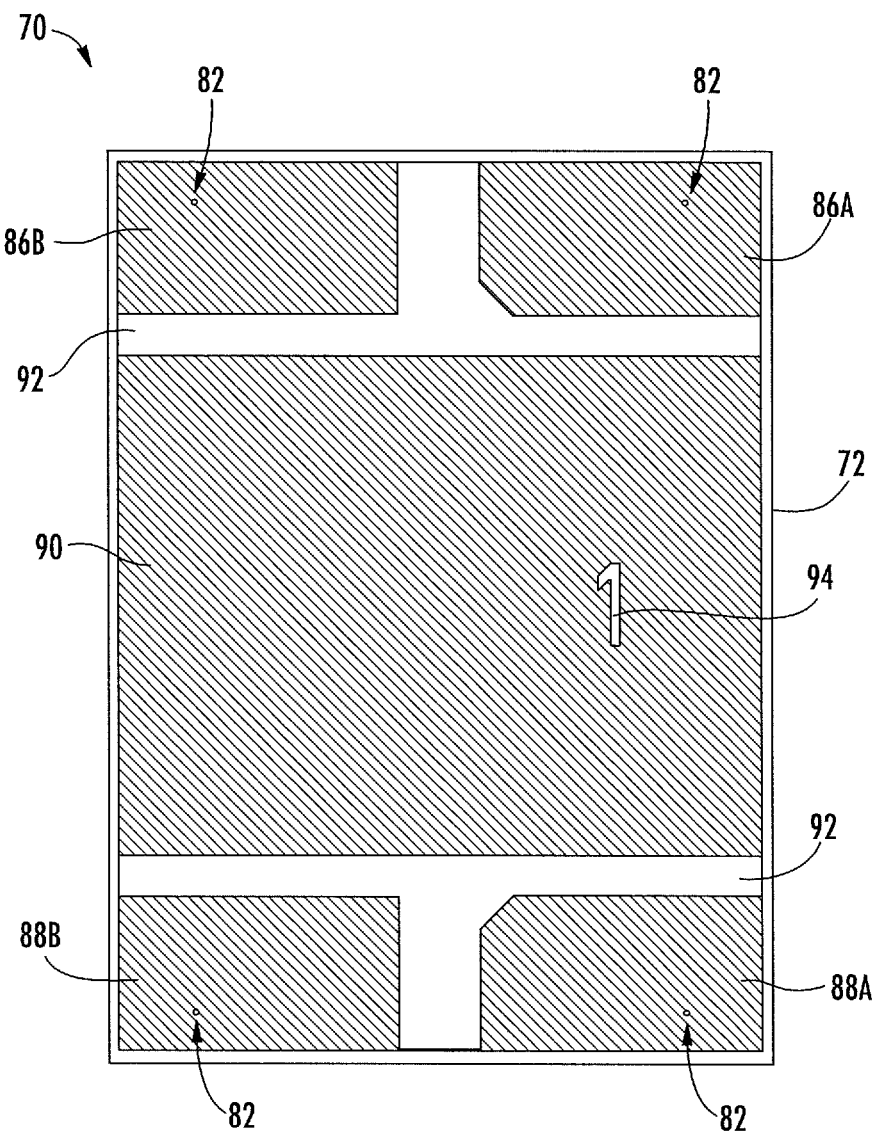

FIGS. 4A to 4D illustrate another embodiment of a light emitter package, generally designated 70, according to the present subject matter. FIG. 4A is a top view of a submount 72. Submount 72 can comprise a non-metallic and in some aspects a ceramic based material as previously described For example and in some aspects, submount 72 can comprise AlN or $Al_2O_3$. In some aspects, submount 72 can comprise a front face or top surface 74 upon which a plurality of electrical traces and an array of light emitters can be disposed. In some aspects, multiple light emitters, such as multiple LED chips (114, FIGS. 5A and 5B) can be disposed in an array over package 70. Each of the plurality of traces can comprise one or more layers of metal which can be deposited over submount 72 via a deposition process, and which are schematically illustrated in shaded lines for illustration purposes. A plurality of trenches or gaps G can be disposed between electrical traces. In some aspects, gaps G can be etched after deposition of a large area of metal, in other aspects, chemical or mechanical removal processes can be used for gap G formation.

Notably, light emitter package 70 can comprise a control scheme utilizing the provision of more than one pair of electrical traces comprised of opposing electrical polarity. Any control scheme can be provided however, and in some aspects, just one (e.g., FIG. 1) or more than two pairs of traces comprised of opposing electrical polarity can be provided. Each pair of traces comprised of an anode and a cathode can be configured to supply electrically current to a different and mutually exclusive string of light emitters or LED chips.

For example and in some aspects, package 70 can comprise a first pair of first and second electrical traces 76A and 76B, respectively. First and second electrical traces 76A and 76B can comprise opposing electrical polarity. For example, first trace 76A can comprise an anode as indicated by the "+" sign formed therein, and second trace 76B can comprise a cathode. Together, first pair of first and second electrical traces 76A and 76B can supply current to at least one string of serially connected LED chips disposed in an array over submount 72. In some aspects, first and second traces 76A and 76B can be disposed at a first end of submount 72, and another pair of traces can be disposed at an opposing second end of submount 72.

In some aspects, package 70 can comprise a second pair of third and fourth electrical traces 78A and 78B, respectively. Third and fourth electrical traces 78A and 78B can comprise opposing electrical polarity. For example, third trace 78A can comprise an anode as indicated by the "+" sign formed therein, and fourth trace 78B can comprise a cathode. Together, second pair of third and fourth electrical traces 78A and 78B can supply current to at least one other or second string of LED chips disposed in an array over submount 72. In some aspects, the first string (e.g., controlled by the first pair of electrical traces) and the second string (e.g., controlled by the second pair of electrical traces) can comprise different colors. That is, the first pair of first and second traces 76A and 76B can control and/or electrically communicate with a first set of LED chips of a first color and second pair of third and fourth traces 78A and 78B can control and/or electrically communicate with a second set of LED chips of a second, different color. Notably, intermingled strings of BSY and RDO chips can be provided herein, and can offer improved color rendition, as colored objects appear truer to an inherent color point.

In some aspects, first trace and third traces 76A and 78A, respectively, can be disposed adjacent each other and separated by a large trench or gap G. In some aspects, second trace and fourth traces 76B and 78B, respectively, can be disposed adjacent each other and separated by a large trench or gap G. Similarly, first trace 76A can be separated from second trace 76B by a trench or gap G and third trace 78A can be separated from fourth trace 78B by a gap G. In some aspects, first, second, third, and fourth traces 76A, 76B, 78A, and 78B, respectively, can be disposed proximate the four outermost corners of submount 72. In some aspects, first second, third, and fourth traces 76A, 76B, 78A, and 78B, respectively, can electrically communicate with respective bottom contacts (FIG. 4C) by passing current along one or more internally disposed vias 82. Vias 82 can comprise internal conduits disposed within portions of submount 72. Vias 82 can be adapted to pass electrical current between traces on top surface 74 and surface-mount contacts on a bottom surface 84 of submount 72. In some aspects, vias 82 can comprise passages filled or partially plated with electrically conductive material, such as Ag, Cu, Sn, Au, or combinations thereof.

Still referring to FIG. 4A and in some aspects, a plurality of intermediate traces, generally designated 80, can be disposed between portions of first, second, third and fourth traces 76A, 76B, 78A, and 78B, respectively. In some aspects, the plurality of intermediate traces 80 can be centrally disposed with respect to submount 72. In some aspects, a plurality of LED chips (FIGS. 5A/5B) can be mounted over portions of individual traces 80A within the plurality of traces 80. Notably, the plurality of traces 80 can allow LED chips to be spaced close together for improved optical mixing of light from differently colored LED chips. Individual traces 80A within the plurality of traces can comprise different sizes and/or shapes adapted to receive different sizes and/or shapes of LED chips. Notably, intermediate traces 80 and/or first, second, third, and fourth traces, 76A, 76B, 78A, and 78B, respectively, can comprise areas of exposed metal. This can advantageously improve light emission by improving reflection within package. Traces can be optionally coated or plated with an additional reflective material, such as Ag or a coating comprised of reflective particles where desired to further improve reflection and light emission.

Notably, a reflective material can be disposed within trenches or gaps G. This can advantageously further improve light emission by improving reflection from surfaces within trenches. In some aspects, multi-chip packages can comprise gaps which can trap or absorb light. In some aspects, a white, silver, or silver-white plastic or solder mask material can be provided in gaps G. In some aspects, package 70 is designed for maximum light reflectivity with reflective exposed metal covering a large portion of top surface 74 of submount 72, along with white solder mask in trenches or gaps G.

FIG. 4B is a side view of package 70. As FIG. 4B illustrates, traces disposed on top surface 74 of submount 72 can be at least partially aligned over surface-mount contacts or pads disposed on a bottom surface 84 of submount 72. In some aspects, bottom surface 84 can comprise first and second bottom contacts 86A and 86B (FIG. 4C) at least partially aligned over and/or in electrical communication with first and second traces 76A and 76B. Bottom surface 84 can further comprise third and fourth bottom contacts 88A and 88B (FIG. 4C) at least partially aligned over and/or in electrical communication with third and fourth traces 78A and 78B. A metallized contact pad 90 can be disposed on bottom surface 84 of submount. Metallized contact pad 90 can comprise a localized heat sink at least partially aligned below the plurality of traces 80 and LED chips mounted thereto, for improving dissipation of heat within package 70. Metallized contact pad 90 can be mounted to an external heat sink, not shown.

FIG. 4C is a bottom view of package 70. As noted above, bottom surface 84 of submount 72 can comprise four or more surface-mount contacts or pads. In some aspects, two sets of bottom contacts can be provided, where each set of bottom contacts can comprise two pads of opposing electrical polarity. Each pair of bottom contacts can be configured to electrically communicate to a respective pair of traces by transferring current along electrically conductive vias 82.

Figure 5A:
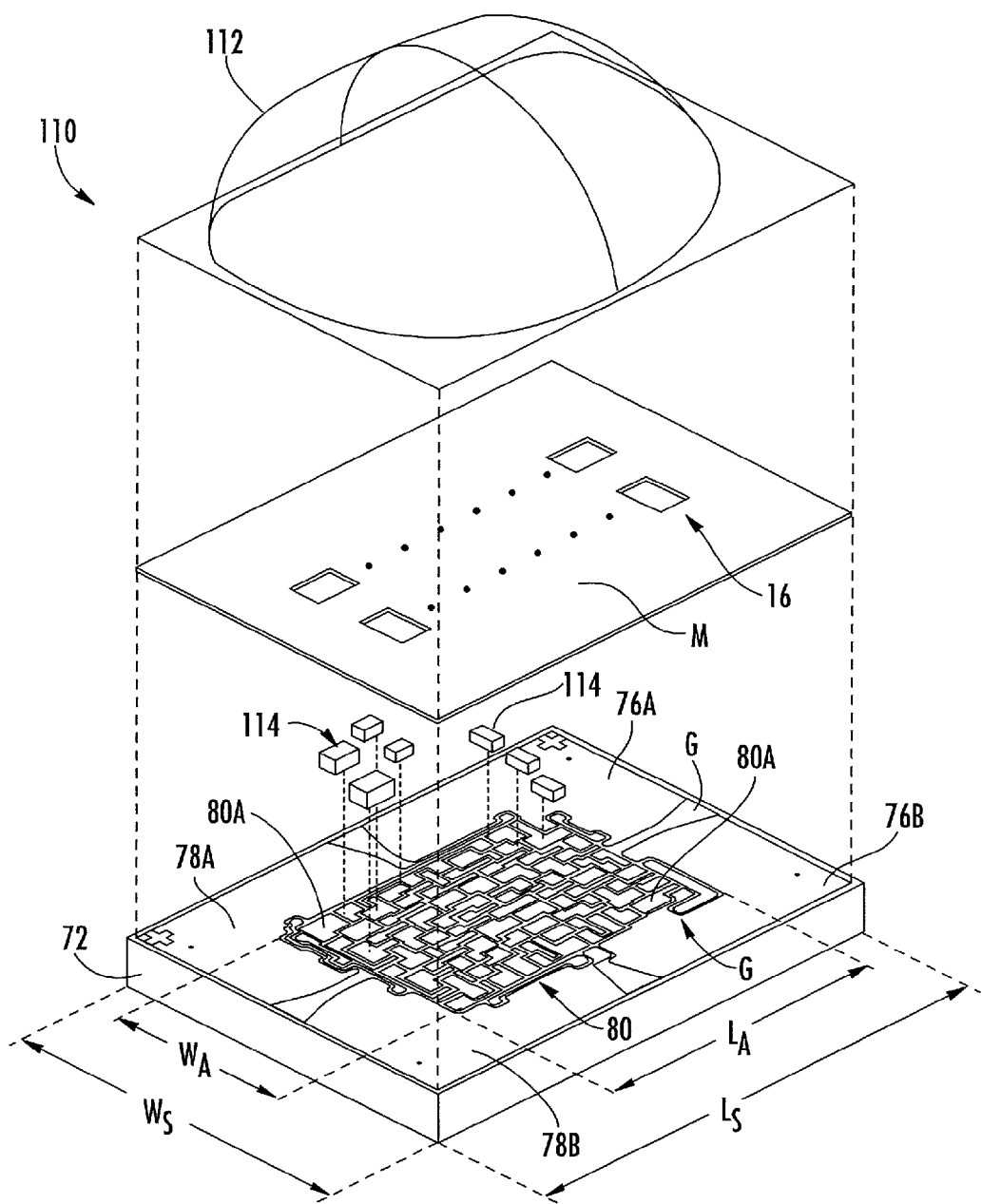
FIG. 5A is an exploded view illustrating a light emitter package according to further aspects of the present subject matter.
Figure 5B:
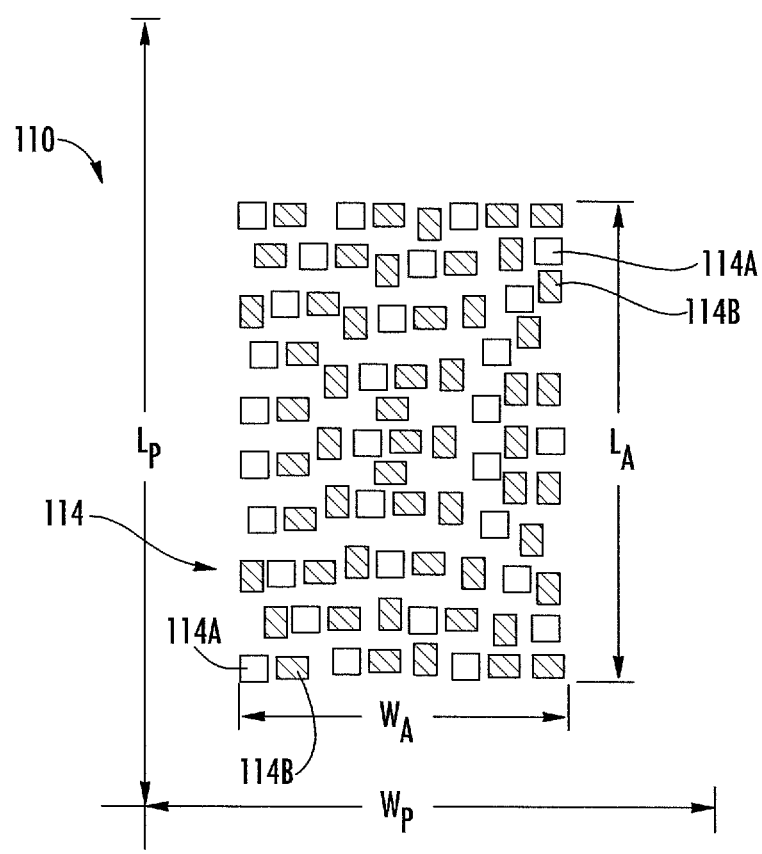
FIG. 5B is a schematic view illustrating an LED chip layout according to further aspects of the present subject matter.

In some aspects, a first pair of bottom contacts can comprise a first contact 86A and a second contact 86B. A second pair of bottom contacts can comprise a third contact 88A and a fourth contact 88B. Each pair of bottom contacts can comprise an anode/cathode pair adapted to pass current from an external circuit or source (not shown) to traces for illuminating LED chips mounted to the traces (FIGS. 5A and 5B). In some aspects, first trace 76A can be aligned over and/or electrically communicate with first bottom contact 86A. Similarly, second trace 76B can be aligned over and/or electrically communicate with second bottom contact 86B. Similarly, third trace 78A can be aligned over and/or electrically communicate with third bottom contact 88A. In some aspects, fourth trace 78B can be aligned over and/or electrically communicate with fourth bottom contact 88B. In some aspects, bottom contacts can be disposed proximate outermost, opposing corners of submount 72.

Still referring to FIG. 4C, in some aspects, a metallized contact pad 90 can be provided. In some aspects, metallized contact pad 90 can be disposed in a central portion of submount 72. One or more areas of electrically insulating material 92 can be provided between metallized contact pad 90 and each of the other bottom contacts. In some aspects, insulating material 92 can comprise a solder mask, plastic, polymer, of any color, such as green. In some aspects, package 70 can comprise an optional numeral 94 to identify the panel component. The numeral 94 is optional, and where used, can change location based on the location of the component on the large panel prior to singulation.

Figure 4D:
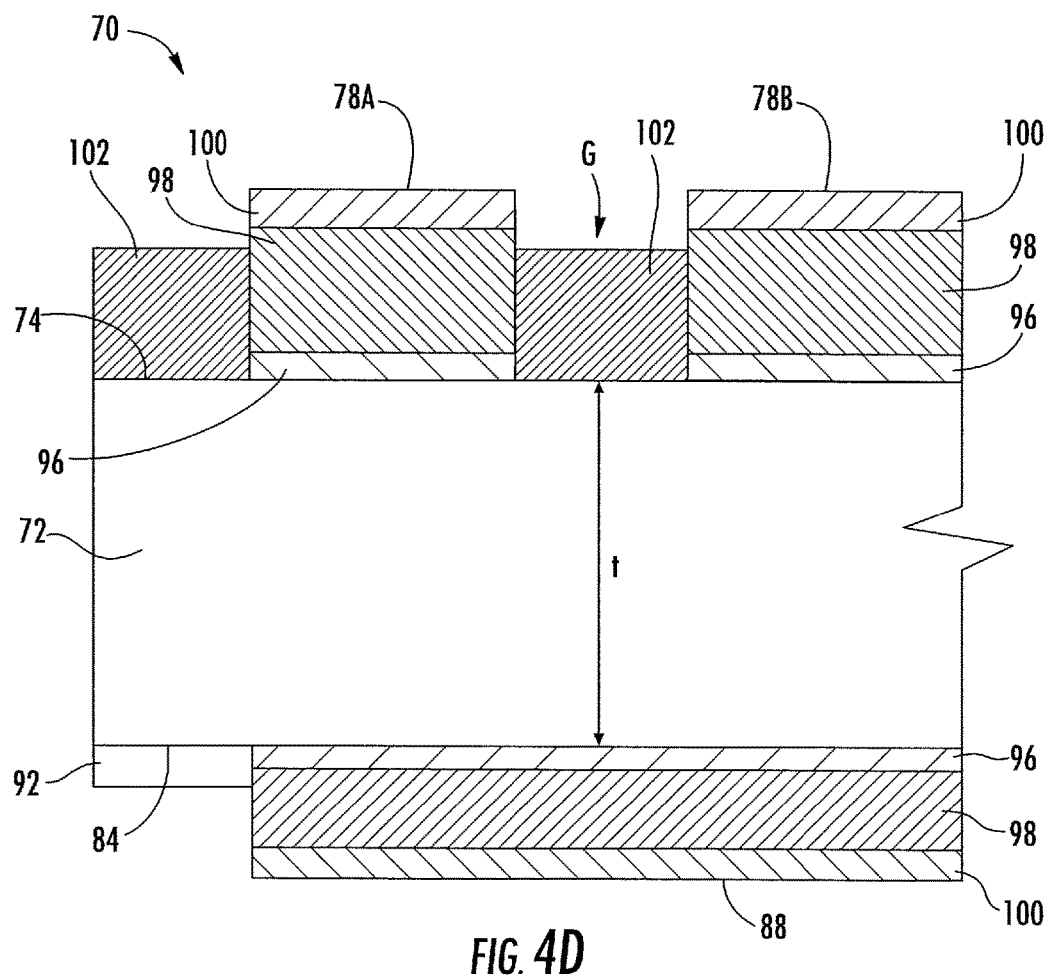

Referring now to FIG. 4D, a sectional view of package 70 is shown, and corresponds to the circled area indicated in FIG. 4A. For illustration purposes, arbitrary top traces and/or bottom contacts may be illustrated in this view. In some aspects, submount 72 can comprise a thickness t. In some aspects, thickness t can for example comprise approximately 0.5 mm, but can vary between approximately 0.1 mm and 1 mm where desired. In some aspects, thickness t can be between approximately 0.1 to 0.4 mm, approximately 0.4 to 0.5 mm, or approximately 0.5 to 1 mm.

Submount 72 can comprise one or more layers of material deposited thereon for forming traces on top surface 74 and contacts on bottom surface 84. In some aspects, top traces and bottom contacts can comprise the same material or materials. In some aspects, portions of third and fourth traces 78A and 78B are shown, and may not be shown to scale. A trench or gap G can be disposed therebetween. In some aspects, third and fourth traces 78A and 78B and fourth bottom contact 88B can each comprise a first layer of material 96, a second layer of material 98, and an optional third layer of material 100. More than three layers of material can be provided. In some aspects, first layer of material 96 can comprise an adhesion layer of material. In some aspects, first layer of material 96 can comprise Ti. The Ti can be approximately 0.06 µm thick. In some aspects, the Ti can be less than approximately 0.06 µm thick, or more than 0.06 µm thick depending upon process variability. For example, first layer of material 96 can range in thickness from between approximately 0.04 µm to 0.06 µm or from between approximately 0.06 µm and 0.08 µm.

In some aspects, second layer of material 98 can comprise an electrically conductive layer of material, such as electrolytic Cu. The electrolytic Cu can be burnished and polished. In some aspects, the electrolytic Cu can be approximately 50 µm thick. In some aspects, the Cu can be less than approximately 50 µm thick, or more than 50 µm thick depending upon process variability. For example, second layer of material 98 can range in thickness from between approximately 40 µm to 50 µm or from between approximately 50 µm and 60 µm.

In some aspects, an optional third layer of material 100 can be provided. In some aspects, third layer of material 100 can comprise a reflective layer of material, such as Ag. In some aspects, the Ag can be deposited via an electroless process, and can comprise electroless Ag. In some aspects, the electroless Ag can range in thickness from between approximately 0.2 µm to 0.5 µm, for example, from between approximately 0.2 µm and 0.3 µm; between approximately 0.3 µm and 0.4 µm; and/or between approximately 0.4 µm and 0.5 µm.

In some aspects, a reflective layer of material 102 can be provided in portions of trenches or gaps, such as gap G, disposed on upper surface 74 of submount 72. In some aspects, reflective material 102 can be provided adjacent the trace layers of material including the first reflective layer 100. Reflective layer of material 102 can be provided on top surface 74 of submount 72, in some aspects, directly over portions of submount 72. Reflective layer of material 102 can also be provided proximate the outermost edges of submount 72. In some aspects, reflective layer of material 102 can comprise a white, silver, or silver-white plastic, polymeric, or solder mask material. In some aspects, the solder mask can be deposited such that it is approximately flush with and/or below adjacent traces disposed on upper surface 74 of submount 72. In some aspects, reflective layer of material 102 can be approximately 25 µm or less in thickness, such as approximately 20 µm or less, approximately 15 µm or less, or less than approximately 10 µm.

As FIG. 4D further illustrates and as described in FIG. 4C, an electrically insulating material 92 can be provided between portions of metallization layer and bottom contacts. Insulating material 92 can also be disposed adjacent outermost portions of submount 72. In some aspects, insulating material 92 can comprise a solder mask. In some aspects, insulating material 92 can comprise a green solder mask that is between approximately 10 µm and approximately 13 µm thick.

FIG. 5A illustrates another embodiment of a light emitter package, generally designated 110. Package 110 can comprise a submount 72 having a trace design and bottom contact design as illustrated and described in FIGS. 4A to 4D. Package 110 can further comprise a lens 112. Notably, lens 112 can comprise an asymmetric or asymmetrically shaped lens as described in FIGS. 3A to 3C. Lens 112 can be non-centrally disposed with respect to a center axis of LED chips. Lens 112 can be offset from a center of the LED populated area (e.g., offset from the center of the chips 114).

A plurality of LED chips, generally designated 114, can be disposed over portions of individual traces 80A of the plurality of traces 80. In some aspects, lens 112 can be offset from a center of the LED populated area (e.g., offset from the center of the chips 114). As described in FIGS. 5B and 6, LED chips 114 can comprise different sizes, shapes, and/or colors. In some aspects, first and second traces 76A and 76B can control and/or electrically communicate with a first string of serially connected LED chips and third and fourth traces 78A and 78B can control and/or electrically communicate with another string of serially connected LED chips. More than two strings of serially connected LED chips can be controlled by any number of anode/cathode trace pairs. In some aspects, first and second traces 76A and 76B can electrically communicate with a string of serially connected blue shifted yellow (BSY) LED chips and third and fourth traces 78A and 78B can electrically communicate with a string of serially connected red or red-orange (RDO) LED chips. Such chips can be intermingled and closely packed for providing improved color mixing to achieve white light that is approximately 4000 K and 70 CCT or greater.

In some aspects, package 110 can comprise an LED populated area or source size the bounds of which can comprise a length $L_A$ and a width $W_A$ that can be scaled up or down to fit other form factors depending upon the application. The number of LED chips 114 disposed within LED populated area can vary depending upon the desired CRI and/or scotopic/photopic (SIP) ratio. In some aspects, LED populated area comprises a length $L_A$ and width $W_A$, respectively, of approximately 6.2 mm×4.2 mm. In some aspects, length $L_A$ can vary between approximately 4 mm and 8 mm; for example, $L_A$ can comprise a length of approximately 4 mm or more; approximately 5 mm or more; approximately 6 mm or more; or approximately 8 mm. In some aspects, width $W_A$ can vary between approximately 2 mm and 6 mm; for example, width $W_A$ can comprise approximately 2 mm or more; approximately 4 mm or more; approximately 5 mm or more; or approximately 6 mm. In some aspects, the area occupied by LED chips can comprise approximately 26 mm² (e.g., $L_A \times W_A$). In some aspects, the LED populated area can comprise approximately 18 mm² or more, approximately 25 mm² or more, or approximately 30 mm² or more.

In some aspects, LED populated area can be disposed over submount 72 having a length $L_S$ and a width $W_S$, respectively, of approximately 11 mm×8 mm. In some aspects, submount length $L_S$ can vary between approximately 6 mm and 15 mm. For example, $L_S$ can comprise a length of approximately 6 mm or more, approximately 8 mm or more, approximately 10 mm or more, or approximately 12 mm. In some aspects, submount width $W_S$ can vary between approximately 5 mm and 10 mm. For example, $W_S$ can comprise approximately 5 mm or more, approximately 7 mm or more, approximately 8 mm or more, or approximately 10 mm. In some aspects, the overall submount area can comprise approximately 88 mm². In some aspects, the LED populated area can comprise approximately 60 mm² or more, approximately 90 mm² or more, or approximately 100 mm² or more. In some aspects, the ratio between LED populated area and submount area can be approximately 0.3. The ratio between LED populated area and submount area can be approximately 0.2 or more, 0.3 or more, 0.4 or more, or 0.5. Although rectangular submounts 72 are illustrated herein, other non-rectangular shaped submounts (e.g., squares, ovals, and circles) can be provided and are contemplated herein.

In one aspect in accordance with the disclosure herein and materials submitted herewith, LED package 110 can for example utilize an array of LED chips 114, wherein the array can be in a tightly packed square, ellipse, truncated ellipse, or rectangular configuration. In other aspects LED chips 114 can be arranged in any geometry that substantially follows the lens outline, and can be asymmetrical. In some aspects, for example and as show in FIG. 5B, LEDs 114 can be arranged in an asymmetric pattern, where the pattern consists of at least a first type of LED chip 114 and a second type of LED chip 114B. That is, first and second types of LED chips 114A and 114B, respectively, can be arranged in an asymmetric (non-repetitive or non-repeating) pattern in at least one row and/or at least one column, and can comprise various white "clusters" comprised of first and second chips 114A and 114B. Asymmetric lens 112 can be disposed over a portion of each LED chip 114. In some aspects, asymmetric lens 112 can be offset a distance from center of the LED array as illustrated in FIG. 3A. As described below, the LED package can for example comprise more than one, and in some instances two pairs of traces for controlling and/or electrically communicating with at least two serially connected strings of LED chips 114, each sting of chips being a different color. Notably, such placement and use of multi colored chips improves the white light emission and, therefore, coloring rendering capabilities.

Notably, as further illustrated by FIG. 5A, some of the plurality of LED chips 114 can be selectively coated with phosphor during the manufacturing process. For example, in some aspects, the second type of LED chips 114B, which can be primarily blue in color, can be selectively coated with phosphor. A mask or stencil M can be temporarily used during fabrication of package 110. In some aspects, mask M can comprise openings 116 adapted to expose second type of LED chips 114B while covering first type of LED chips 114A. After placement of mask M over the plurality of LED chips, a phosphor material can be dispensed, sprayed, painted, or otherwise applied over mask M. The exposed LED chips (e.g., second type of LED chips 114B) can become coated with the applied phosphor and the covered LED chips (e.g., first type of LED chips 114A) will not be coated with the applied phosphor. Accordingly, some LED chips can be selectively coated. After the phosphor is applied, mask M will be removed and package 110 can be molded or encapsulated. In some aspects, methods described herein can comprise selectively masking a portion of the light emitter chips (e.g., via mask M) and applying a phosphor over the mask M. In some aspects, this method can further comprise applying phosphor selectively to a portion of the light emitter chips.

FIG. 5B schematically illustrates the layout and/or array of LED chips 114 as they are disposed over the plurality of traces (FIGS. 4, 5A). The plurality of LED chips 114 can comprise a first type of LED chips 114A and a second type of LED chip 114B, illustrated in shading. The first type of LED chip 114A can comprise a different color than second type of LED chip 114B. The intermingled, comingled and/or interdispersed and tightly spaced LED chips 114 of different colors can be operable to produce a high CRI and efficacy at a power of 8 W or more.

In some aspects, first type of LED chip 114A can emit light having a having a dominant wavelength in the range of from approximately 600 nm to approximately 630 (i.e., a primarily red, or red-orange (RDO) light emitter). In further aspects, first type of LED chip 114A can be used in combination with second type of LED chip 114B, which can comprise a dominant wavelength in the range of from approximately 430 nm to approximately 480 nm (i.e., a primarily blue light emitter). The blue LED chips can be at least partially covered with one or more phosphors or lumiphors which can emit light having a dominant wavelength in the range of from approximately 555 nm to approximately 585 nm (i.e., (i) and (ii) together can be deemed a "blue shifted yellow" or "BSY" light emitter). Together, illumination from first and second types of LED chips 114 in addition to the phosphor can mix and emit an overall light that is approximately 4000 K.

In some aspects, light emitter package 110 having at least two different types and differently controlled LED chips 114 can have an efficacy of at least approximately 80 LPW. In some aspects, light emitter packages according to the subject matter herein can have an efficacy of at least approximately 90 LPW, at least approximately 95 LPW, at least approximately 100 LPW, at least approximately 125 lumens per watt, at least approximately 140 LPW, at least approximately 150 LPW, or in some aspects more than approximately 150 LPW. Such efficacy results can be attained when measured at approximately 65° C. and 50 mA, and/or an input power of approximately 10 W.

Still referring to FIG. 5B, differently sized first and second LED chips 114A and 114B can be provided and incorporated into light emitter package 110 and packages described herein. In some aspects, first type of LED chips 114A can comprise substantially square shaped RDO chips. The first type of LED chips 114A can comprise vertically or horizontally structured chips which can be wirebonded to portions the plurality of traces 80 disposed over submount 72. First type of LED chip 114 can comprise a length and a width that can be substantially the same and in some aspects can be approximately 25 µm or more per side, approximately 50 µm or more per side, approximately 75 µm or more per side, approximately 100 µm or more per side, approximately 150 µm or more per side, approximately 200 µm or more per side, or more than 250 µm.

Notably, second type of LED chip 114B can comprise a direct attached chip (e.g., no wire bonds necessary). In other words, second type of LED chips 114B can comprise a chip-on-board (COB) arrangement over submount of package 110. This can contribute to improved brightness, light extraction, and/or cost per package or device by obviating the coast associated with wirebonds which may interfere with and/or block light. In some aspects, second type of LED chip 114B can comprise a horizontally structured chip having a bondpad-down design which allows for eutectic direct die attach and eliminates the need for wire bonds, which enables superior performance from improved thermal management. In some aspects and as illustrated, die attaching second type of LED chip 114B can use any suitable material and/or technique (e.g., solder attachment, preform attachment, flux or no-flux eutectic attachment, silicone epoxy attachment, metal epoxy attachment, thermal compression attachment, and/or combinations thereof) can directly electrically connect second type of LED chip 114B to electrical elements of LED package 110, such as the plurality of traces 80, without requiring wire bonds. In one aspect, a eutectic direct die-attach process can be used to connect second type of LED chips 114B to traces 80 of LED package 110.

In some aspects, second type of LED chip 114B can comprise a square chip or a non-square (e.g., rectangle chip. In some aspects, second type of LED chip 114B can comprise a rectangle having a length 1 mm (e.g., 1000 µm) or less in at least one direction. In other aspects, second type of LED chip 114B can have a length of approximately 0.85 mm (e.g., 850 µm) or less in at least two directions, such as opposing sides of approximately 0.70 mm (e.g., 700 µm), approximately 0.50 mm (e.g., 500 µm), approximately 0.40 mm (e.g., 400 µm), and approximately 0.35 mm (e.g., 350 µm) or less. Second type of LED chips 114B can also comprise square chips, such as chips that can be approximately 1000 µm×1000 µm in size, approximately 800 µm×800 µm in size, approximately 500 µm×500 µm in size, and/or approximately 350 µm×350 µm in size.

LED chips 114 described herein can comprise any combination of LED chips having straight cut sides, bevel cut sides, any type of build (e.g., horizontal or vertical), require wirebonds, be direct attached (e.g., COB LEDs), have any shape, or have any size. Notably, at least two different colors of LED chips 114 can be provided, which can be used in combination with at least one phosphor.

Still referring to FIG. 5B, a plurality of light emitters or LED chips 114 can be provided over a submount of a light emitter package in a chip on board (COB) array. The plurality of LED chips 114 can comprise multiple clusters of emitters adapted to emit white light upon mixing of light emitted by the cluster. That is, the plurality of LED chips 114 can include multiple clusters of first and second types of LED chips 114A and 114B, respectively, which can be adapted to emit light that upon mixing forms white light. LED chips 114 can be provided below and asymmetric lens (see e.g., FIG. 3A to 3C). In some aspects, a center of the COB array of LED chips 114 can be offset from a center of the asymmetrical lens (e.g., FIG. 3A). In some aspects, the COB array of LED chips 114 can comprise an asymmetric and/or non-repeating or non-repetitive pattern.

Figure 6:
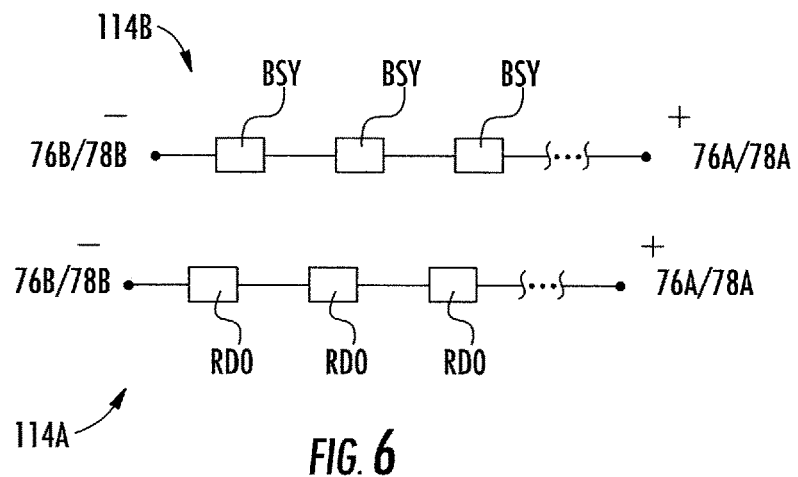
FIG. 6 is a schematic circuit diagram illustrating the electrical connectivity of the LED chips according to one aspect of the present subject matter.

FIG. 6 illustrates a circuit diagram schematically illustrating the electrical connectively of chips within package 110. As FIG. 6 illustrates, a first string of first type of LED chips 114A can be connected to and operable between a first anode and a first cathode. A second string of second type of LED chips 114B can be connected to and operable between a second anode and a second cathode. The anode and cathode pairs can comprise any pair previously described, for example, 76A and 76B or 78A and 78B. Notably, first string of first type of LED chips 114A can be mutually exclusive and/or individually controllable from second type of LED chips 114B.

In some aspects, the plurality of LED chips 114 within packages described herein can comprise any number, chip count, or percentage of first type of LED chips 114A mixed and/or combined with any number, chip count, or percentage of second type of LED chips 114B. Table 1 below illustrates various possibilities for chip count and percentage of RDO content (e.g., % of light emitted from RDO chips) contained within LED chip populated area $L_A \times W_A$ (FIG. 5B). As Table 1 illustrates, the chip count can vary based upon the desired output or target results. The power and LPW values are typical of measurements obtained at 65° C. and 50 mA, and/or an input power of approximately 50 W.

TABLE 1

| TARGET OUTPUT | BSY CHIP COUNT | RDO CHIP COUNT | POWER | LUMENS PER WATT (LPW) |
|---|---|---|---|---|
| 18.9% RDO | 54 | 30 | 11.25 | 109 |
| 10% RDO (S/P < 2) | 54 | 16 | 9.6 | 116 |
| 20% RDO (S/P > 2) | 48 | 30 | 10.6 | 108 |

Table 1 above illustrates various power and efficacy results that can be achieved by varying chip count. In some aspects, as a percentage of RDO (% RDO) light emitted by the LED populated area increases, the scotopic/photopic (S/P) ratio can decrease. For example, in some aspects, increasing the RDO % per light emitter package, for example, to about 20% or more, can increase the S/P ratio above 2 (i.e., S/P>2), which can be better for nighttime illumination. In some aspects, decreasing the RDO % per light emitter package, for example, to about 10% or less, can decrease the S/P ratio below two (i.e., S/P<2), which can be better for daytime illumination. The number of BSY and RDO chips per string and/or per LED populated area can be varied to produce desired output.

Figure 7B:
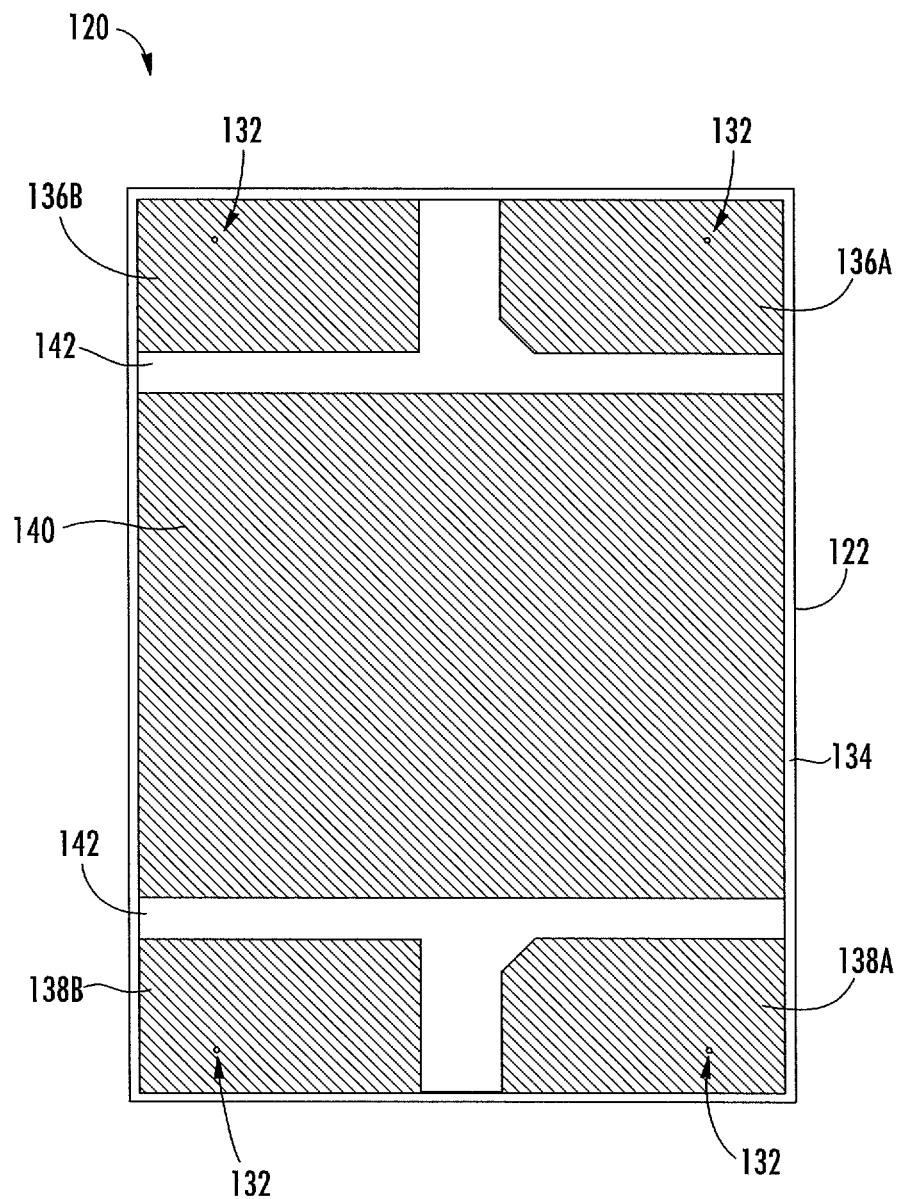

FIGS. 7A and 7B illustrate another embodiment of a light emitter package, generally designated 120. FIG. 7A is a top view of a submount 122. Submount 122 can comprise a non-metallic and in some aspects a ceramic based material as previously described For example and in some aspects, submount 122 can comprise AlN or Al$_2$O$_3$. In some aspects, submount 122 can comprise a front face or top surface 124 upon which a plurality of electrical traces and an array of light emitters can be disposed. In some aspects, multiple light emitters, such as multiple LED chips (154, FIG. 8) can be disposed in an array over package 120. Each of plurality of traces can comprise one or more layers of metal which can be deposited over submount 122 via a deposition process, and which are illustrated in shaded lines for illustration purposes. A plurality of trenches or gaps G can be disposed between electrical traces. In some aspects, gaps G can be etched after deposition of a large area of metal, in other aspects, chemical or mechanical removal processes can be used for gap G formation.

Notably, light emitter package 122 can comprise a control scheme similar to package 70 (FIG. 4A), which utilizes the provision of more than one pair of electrical traces comprised of opposing electrical polarity. Any control scheme can be provided however, and in some aspects, just one (e.g., FIG. 1) or more than two pairs of traces comprised of opposing electrical polarity can be provided. Each pair of traces comprised of an anode and a cathode can be configured to supply electrically current to a different string of light emitters or LED chips.

For example and in some aspects, package 120 can comprise a first pair of first and second electrical traces 126A and 126B, respectively. First and second electrical traces 126A and 126B can comprise opposing electrical polarity. For example, first trace 126A can comprise an anode as indicated by the "+" sign formed therein, and second trace 126B can comprise a cathode. Together, first pair of first and second electrical traces 126A and 126B can supply current to at least one string of serially connected LED chips disposed in an array over submount 122. In some aspects, first and second traces 126A and 126B can be disposed at a first end of submount 122, and another pair of traces can be disposed at an opposing second end of submount 122.

In some aspects, package 120 can comprise a second pair of third and fourth electrical traces 128A and 128B, respectively. Third and fourth electrical traces 128A and 128B can comprise opposing electrical polarity. For example, third trace 128A can comprise an anode as indicated by the "+" sign formed therein, and fourth trace 128B can comprise a cathode. Together, second pair of third and fourth electrical traces 128A and 128B can supply current to at least one other string of LED chips disposed in an array over submount 122. In some aspects, a first string controlled by the first pair of electrical traces and a second string controlled by the second pair of electrical traces can comprise different colors. That is, the first pair of first and second traces 126A and 126B can control LED chips of a first color and second pair of third and fourth traces 128A and 128B can control LED chips of a second, different color.

In some aspects, first trace and third traces 126A and 128A, respectively, can be disposed adjacent each other and separated by a large trench or gap G. In some aspects, second trace and fourth traces 128B and 128B, respectively, can be disposed adjacent each other and separated by a large trench or gap G. Similarly, first trace 126A can be separated from second trace 126B by a trench or gap G and third trace 128A can be separated from fourth trace 128B by a gap G. The plurality of gaps can be filled with a reflective material, such as a white, silver, or silver-white solder mask as previously described in FIG. 4D.

In some aspects, first, second, third, and fourth traces 126A, 126B, 128A, and 128B, respectively, can be disposed proximate the four outermost and opposing corners of submount 122. In some aspects, first second, third, and fourth traces 126A, 126B, 128A, and 128B, respectively, can electrically communicate with respective bottom contacts (FIG. 7B) by passing current along one or more internally disposed vias 132. Vias 132 can comprise internal conduits disposed within portions of submount 122. Vias 132 can be adapted to pass electrical current between traces on top surface 124 and surface-mount contacts on a bottom surface 134 (FIG. 7B) of submount 122. In some aspects, vias 132 can comprise passages filled or partially plated with electrically conductive material, such as Ag, Cu, Sn, Au, or combinations thereof.

Still referring to FIG. 7A and in some aspects, a plurality of intermediate traces, generally designated 130, can be disposed between portions of first, second, third and fourth traces 126A, 126B, 128A, and 128B, respectively. In some aspects, the plurality of intermediate traces 130 can be centrally disposed with respect to submount 122. In some aspects, a plurality of LED chips (154, FIG. 8) can be mounted over portions of individual traces 130A within the plurality of traces 130. Notably, the plurality of traces 130 can allow LED chips to be spaced close together for better optical mixing of light from differently colored LED chips. Individual traces 130A within the plurality of traces can comprise rectangular or non-rectangular shaped traces of any size adapted to receive different sizes and/or shapes of LED chips. Notably, intermediate traces 130 and/or first, second, third, and fourth traces, 126A, 126B, 128A, and 128B, respectively, can comprise areas of exposed metal. This can advantageously improve light emission by improving reflection. Traces can be optionally coated or plated with an additional reflective material, such as Ag or a coating comprised of reflective particles, where desired, for example, outside of the LED populated area.

Notably, a reflective material can be disposed within trenches or gaps G. This can advantageously further improve light emission by improving reflection from surfaces within trenches. In some aspects, multi-chip packages comprise gaps which can trap or absorb light. In some aspects, a white, silver, or silver-white plastic or solder mask material can be provided in gaps G. In some aspects, package 120 is designed for maximum light reflectivity with reflective exposed metal covering a large portion of top surface 124 of submount 122, along with white, silver, or silver-white solder mask in trenches or gaps G.

FIG. 7B is a bottom view of package 120. As noted above, bottom surface 134 of submount 122 can comprise four surface-mount contacts or pads. In some aspects, two sets of bottom contacts can be provided, where each set of bottom contacts can comprise two pads of opposing electrical polarity. Each pair of bottom contacts can be configured to electrically communicate to each pair of traces by transferring current along electrically conductive vias 132. Top traces and bottom traces can comprise one or more layers of metal, such as previously described with respect to FIG. 4B.

Figure 8:
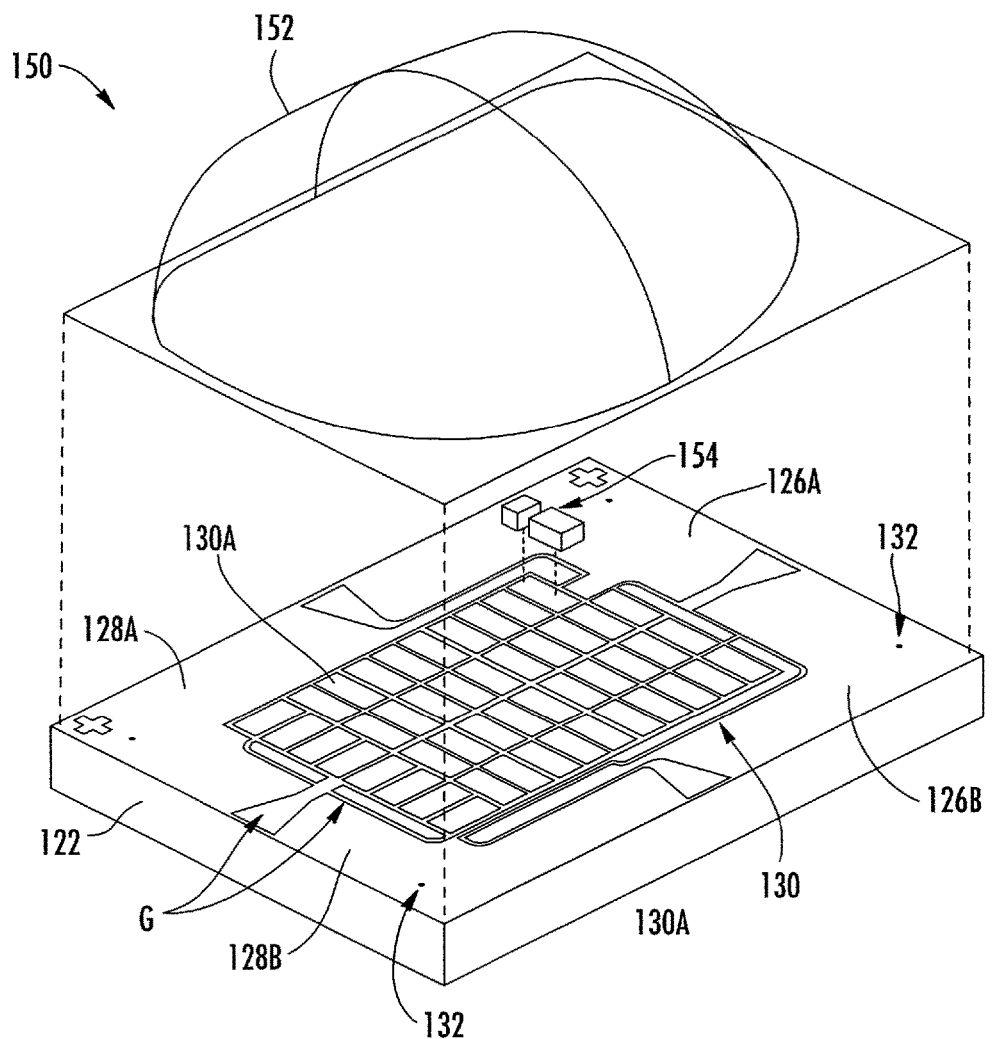
FIG. 8 is an exploded view illustrating a light emitter package according to further aspects of the present subject matter.

In some aspects, a first pair of bottom contacts can comprise a first contact 136A and a second contact 136B. A second pair of bottom contacts can comprise a third contact 138A and a fourth contact 138B. Each pair of bottom contacts can comprise an anode/cathode pair adapted to pass current from an external circuit or source (not shown) to traces for illuminating LED chips mounted to the traces (FIG. 8). In some aspects, first trace 126A can be aligned over and/or electrically communicate with first bottom contact 136A. Similarly, second trace 126B can be aligned over and/or electrically communicate with second bottom contact 136B. Similarly, third trace 128A can be aligned over and/or electrically communicate with third bottom contact 138A. In some aspects, fourth trace 128B can be aligned over and/or electrically communicate with fourth bottom contact 138B. Bottom contacts can be disposed proximate the outermost corners of submount 122.

Still referring to FIG. 7B, in some aspects, a metallized contact pad 140 can be disposed in a central portion of submount 122. One or more areas of electrically insulating material 142 can be provided between metallized contact pad 140 and each of the other bottom contacts. In some aspects, insulating material 142 can comprise a solder mask, plastic, polymer, of any color, such as green.

Referring now to FIG. 8, a light emitter package 150 is illustrated. Package 150 can comprise submount 122 as described in FIGS. 7A and 7B and can further comprise a lens 152. One or more LED chips generally designated 154 can be provided over individual traces 130A of the plurality of traces 130. Notably, lens 152 can comprise an asymmetric or asymmetrically shaped lens such as described in FIGS. 3A to 3C. Lens 152 can be non-centrally disposed with respect to one center axis of the LED chip populated area.

A plurality of LED chips, generally designated 154, can be disposed over portions of individual traces 130A of the plurality of traces 130. LED chips 114 can comprise different sizes, shapes, and/or colors. In some aspects, first and second traces 126A and 126B can control one string of serially connected LED chips and third and fourth traces 128A and 128B can control another string of serially connected LED chips. More than two strings of serially connected LED chips can be controlled by any number of anode/cathode trace pairs. In some aspects, first and second traces 126A and 126B can control a string of serially connected BSY LED chips and third and fourth traces 128A and 128B can control a string of serially connected RDO chips. Such chips can be intermingled and closely packed for providing improved color mixing to achieve white light that is approximately 4000 K.

Figure 9A:
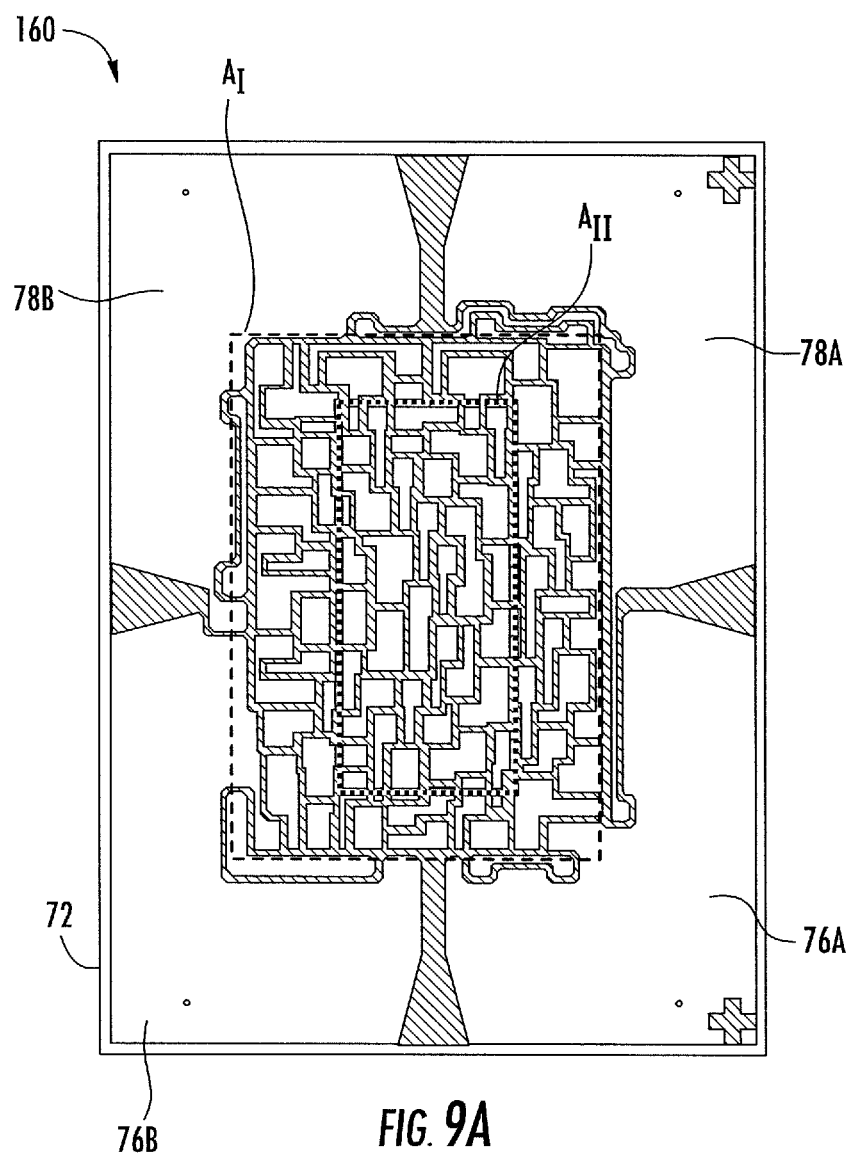
FIGS. 9A and 9B are top views illustrating the source size and primary lens efficacy zone for light emitter packages according to aspects of the present subject matter.
Figure 9B:
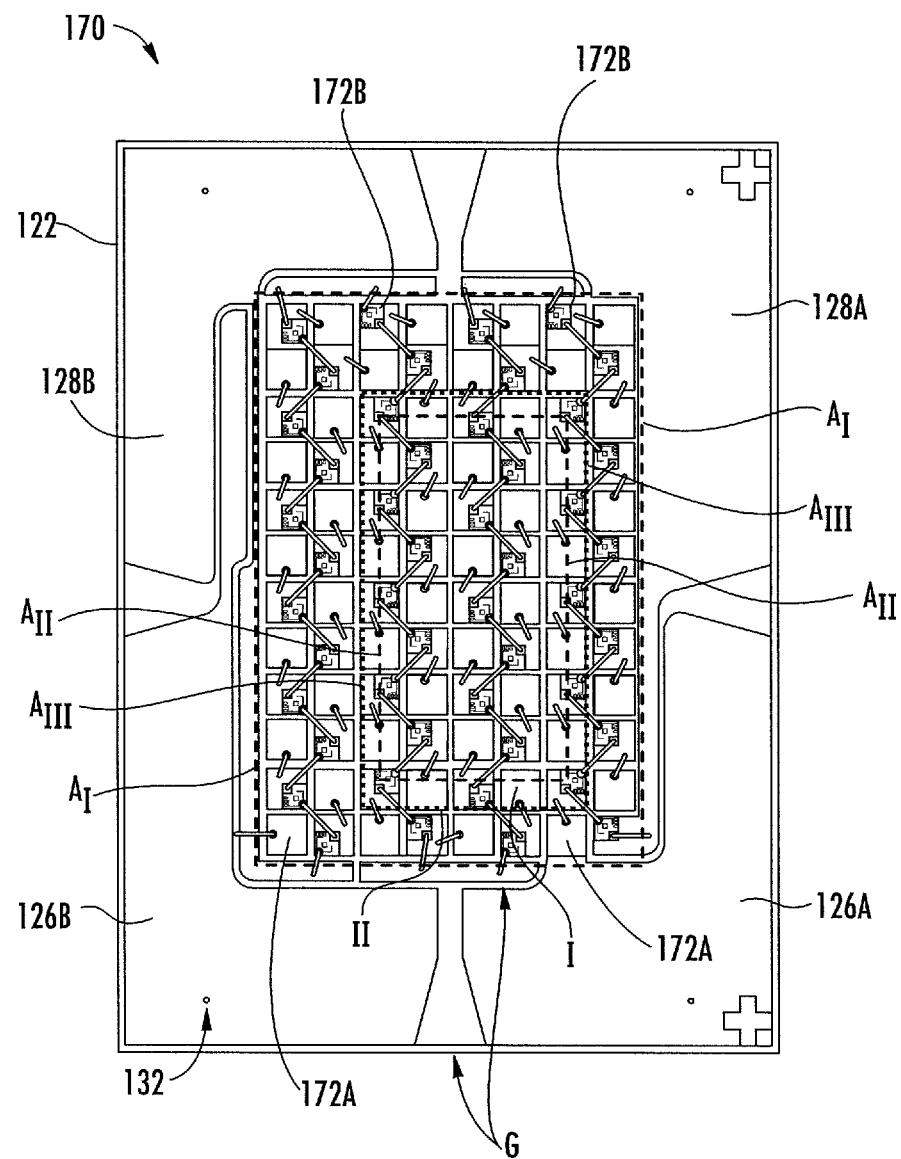

Notably, in some aspects, the BSY chips can comprise horizontally structured chips that can be wirebonded to traces 130 (e.g., see FIG. 9B). The BSY chips can be adjacent to substantially square shaped RDO chips for providing quality color mixing for achieving superior color rendering. In some aspects, the BSY chips can comprise a square chip having a length of at least approximately 350 μm in at least two directions, a length of at least approximately 400 μm in at least two directions, a length of at least approximately 500 μm in at least two directions, a length of at least approximately 800 μm in at least two directions, or a chip that is approximately equal to or greater than approximately 1050 μm in at least two directions. Notably, in some aspects the BSY chips can comprise chips that are pre-coated with phosphor such as described in commonly assigned and co-pending U.S. patent application Ser. No. 11/899,790 which is hereby incorporated by reference in the entirety. Thus, the need for a selective coating step prior to encapsulation can be obviated.

Package 120 can comprise an LED populated area having a length and width of approximately 4.2 mm×6.2 mm as described in FIG. 5A. Submount 122 can comprise an area having a length and a width of approximately 8 mm×11 mm (e.g., in some aspects 8.22×11.25 mm). Numerous other dimensional offsets and measurements are possible and contemplated herein.

In some aspects, the plurality of LED chips 154 can comprise at least 10% RDO, at least 15% RDO, at least 20% RDO, or more than 20% RDO light emission from within the LED populated area. Any number of BSY and RDO chips can be provided. In some aspects, a serially connected string of 16 BSY chips can be used in combination with a serially connected string of 16 RDO chips. In other aspects, a serially connected string of 23 BSY chips can be used in combination with a serially connected string of 22 RDO chips. In further aspects, a serially connected string of 48 BSY chips can be used in combination with a serially connected string of 48 RDO chips. The chip count and ratios can vary depending upon a desired color output or color point of package, a desired brightness output, and/or a desired S/P ratio.

FIGS. 9A and 9B are top views of a source size and a primary lens efficacy zone for light emitter packages according to aspects of the present subject matter. FIG. 9A illustrates a light emitter package, generally designated 160. Package 160 can comprise a submount 72 having first, second, third, and fourth traces 76A, 76B, 78A, and 78B, respectively, such as described with respect to FIGS. 4A to 4D. A plurality of LED chips can be arranged in an array over intermediate traces 80, such as the array shown in FIG. 5B can be disposed over the plurality of traces but such chips are not shown in this view for illustration purposes. As FIG. 9A illustrates, light emitter package 160 can comprise a first area $A_I$ and a second area $A_{II}$. First area $A_I$ can comprise the LED populated area. That is, each LED chip within the package can be confined within the bounds of this area. The respective chip counts, % BSY, and/or % RDO can vary within this area, as desired. In some aspects, first area $A_I$ can comprise a length and width of approximately 6.2 mm×4.2 mm, or an area of approximately 26 mm².

The second area $A_{II}$ can be smaller than first area $A_I$ and can comprise the primary lens efficacy zone for light emitter packages described herein. The primary lens efficacy zone, or second area $A_{II}$, can be the most effective portion of the package from which the lens is designed to emit light, or can correspond to the "sweet spot" of the lens. In some aspects, the asymmetrical primary optic described herein can be designed to have a primary lens efficacy zone (e.g., $A_{II}$) of approximately 10 mm² (i.e., a length and width of approximately 4.4 mm×2.2 mm). Packages described herein can be designed such that as much true white epi (e.g., active area of BSY and RDO LED chips which mixes to emit white light) becomes packed into the primary lens efficacy zone $A_{II}$ to maximize light extraction and optical color mixing.

In some aspects, an overall and total amount of epi area available within the package design illustrated in FIG. 9A can be approximately 12.6 mm². That is, the total amount of epi area available within LED populated area or first area $A_I$ can be approximately 12.6 mm². As noted earlier, first area $A_I$ can comprise approximately 26 mm²; thus, the remaining amount of area is 13.4 mm² (e.g., 26 mm²-12.6 mm²) can be attributed to gap G area and/or non-active area of the LED chips. In some aspects, the amount of epi which can be packed into the primary lens efficacy zone or second area $A_{II}$ can be approximately 4.3 mm². That is, the active area of LED chips within second area $A_{II}$ can be approximately 4.3 mm². The remaining area of 5.7 mm² (e.g., 10 mm²-4.3 mm²) can be attributed to gap G area and/or non-active area of the LED chips. The amount of epi within each area can be maximized for improved primary lens efficacy. These numbers can vary with the type of chip, for example, the amount of epi area described for package 160 is calculated from an array of 54 BSY chips and 30 RDO chips. In other aspects, 54 BSY chips and 16 RDO chips can be provided, 48 BSY chips and 30 RDO chips can be provided; or 44 BSY and 12 RDO chips can be provided. Any combination is contemplated.

FIG. 9B illustrates a light emitter package generally designated 170. Notably, the package design can have more epi available per LED populated area (e.g., first are $A_I$) than described in FIG. 9A. In some aspects, package 170 can also have more epi area packed within the primary lens efficacy zone, such as within a third area $A_{III}$. This is in part due to a shift in LED locations, which can increase the primary lens efficacy zone from that of second area $A_{II}$ of package 160 (also shown in FIG. 9B), by about 0.25 mm on each edge, to third area $A_{III}$. Thus, efficacy zone increases from 10 mm² (represented by $A_{II}$) to approximately 11.4 mm² (e.g., represented by $A_{III}$).

In some aspects, package 170 can utilize submount 122 as previously described in FIGS. 7A and 7B. Submount 122 can comprise first, second, third, and fourth traces 126A, 126B, 128A, and 128B, respectively, such as described with respect to FIGS. 7A and 7B. At least two strings of serially connected LED chips as shown in FIG. 5B can be connected over a plurality of intermediate traces disposed between first through fourth traces.

A first string of LED chips can comprise BSY chips, designated 172A. A second string of LED chips comprises RDO chips, designated 172B. Notably, both BSY and RDO chips can be wirebonded. In some aspects, ideal mixing can be achieved with a checkerboard BSY/RDO chip pattern. That is, each BSY chip 172A can be surrounded by at least two RDO chips 172B and/or adjacent at least two RDO chips 172B on at least two sides. In other aspects, some BSY chips can be surrounded by and/or directly adjacent four RDO chips 172B on each side. Similarly, each RDO chip 172B can be surrounded and/or adjacent at least two, at least three, or at least four BSY chips 172A in a checkerboard array.

FIG. 9B illustrates first area $A_I$, second area $A_{II}$, and a third area $A_{III}$. As noted above, first area $A_I$ can comprise an LED populated area, which can be approximately 26 mm². Second area $A_{II}$ indicates the primary lens efficacy zone of package 160, in FIG. 9A. Package 170 increases epi in the primary lens efficacy zone, and increases the primary lens efficacy zone by about 0.25 mm on each edge to area $A_{III}$. In some aspects, package 170 utilizes BSY chips that can be wirebonded, whereas the design shown in FIG. 9B can utilize BSY chips that are directly attached (e.g., COB LEDs). In some aspects, the package design can vary between having approximately 5 and 8 mm² of epi area within the primary lens efficacy zone, depending upon trace layout.

Table 2 below compares the amount of total amount of epi area that is possible within the LED populated zone, such as $A_I$ and an amount of epi area in the primary lens efficacy zone, such as $A_{II}$ or $A_{III}$.

TABLE 2

| PACKAGE REFERENCE CHARACTER | CHIP COUNT | TOTAL EPI POSSIBLE IN FIRST AREA ($A_I$) (mm²) | EPI AREA IN PRIMARY LENS EFFICACY ZONE | PRIMARY LENS EFFICACY ZONE ($A_{II}$ OR $A_{III}$, APPROX. in mm²) | RATIO OF EPI AREA IN PRIMARY LENS EFFICACY ZONE/ARE OF LENS EFFICACY ZONE | APPROX. RATIO (A1:A2 OR A1:A3) |
|---|---|---|---|---|---|---|
| 160 | 54 BSY + 30 RDO | 12.6 | 4.3 (per area $A_{II}$) | 10 | 0.43 | 3:1 |
| 170 | 48 BSY + 48 RDO | 16.3 | 5.4 (per area $A_{II}$) | 10 | 0.54 | 3:1 |
| 170 | 48 BSY + 48 RDO | 16.3 | 7.73 (when increased to $A_{III}$) | 11.4 | 0.68 | 2:1 |

As the amount of epi area within the optical source area increases, the brightness and package efficiency can increase in part, due to an increase in lens efficacy. In some aspects, packages described herein can comprise an efficiency of approximately 100 LPW or more, which can increase to approximately 125 LPW or more, approximately 138 LPW or more, or 155 LPW or more as the amount of epi within the primary lens efficacy zone increases. Such performance can be obtained from devices tested at 65° C. and 50 mA, and/or an input power of approximately 10 W. As Table 2 above illustrates, the ratio between epi area and primary lens efficacy zone can be more than approximately 0.43 for packages described herein, and in some aspects, as much as 0.68.

In some aspects, as shown in FIG. 9B, the pattern of LED chips can be repetitive and/or symmetric. That is, BSY chips 172A and RDO chips 172B can alternate in a repetitive pattern (e.g., BSY-RDO-BSY-RDO, etc.) in at least one row and/or at least one column. In some aspects, BSY chips 172A can be wirebonded to the trace over which the RDO chips 172B are mounted. In some aspects, the RDO chips 172B can wirebond to other RDO chips 172B.

Embodiments as disclosed herein may provide one or more of the following beneficial technical effects: reduced cost of providing light emitter packages; improved ease of manufacture; improved ease of installation; high brightness; improved color rendering; improved reliability; improved brightness; improved thermal properties and/or thermal management; improved color mixing; and/or option for increasing/decreasing chip counts or % for producing a desired color point and S/P ratio.

While the light emitter packages and methods have been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

We claim:

1. A light emitter package comprising:
a submount;
an array of light emitter chips disposed on a portion of the submount, wherein at least some of the light emitter chips are adapted to emit light of a first dominant wavelength and wherein at least some others of the light emitter chips are adapted to emit light of a second dominant wavelength different than the first dominant wavelength; and
a lens disposed over the submount and covering a plurality of the light emitter chips, wherein the lens is asymmetric, wherein the lens is in contact with the array of light emitter chips, and wherein the lens comprises an apex disposed over the submount, the apex being substantially centered over the submount in a first direction and non-centered over the submount in a second direction orthogonal to the first direction.

2. The package of claim 1, wherein the first dominant wavelength is between approximately 430 nm and approximately 480 nm.

3. The package of claim 1, wherein the second dominant wavelength is between approximately 600 nm to approximately 630 nm.

4. The package of claim 1, wherein at least some of the light emitter chips are at least partially coated with a phosphor adapted to emit light of a third dominant wavelength between approximately 555 nm to approximately 585 nm.

5. The package of claim 1, wherein the package is configured to refract light emitted by the array of light emitter chips toward a preferential direction.

6. The package of claim 1, wherein the array of light emitter chips comprises an LED populated area of approximately 18 mm$^2$ or more.

7. The package of claim 1, wherein the array of light emitter chips comprises an LED populated area of approximately 26 mm$^2$ or more.

8. The package of claim 6, wherein a centerline of the lens in the first direction is offset from a centerline of the LED populated area.

9. The package of claim 8, wherein the centerline of the lens in the first direction is offset from the centerline of the LED populated area in the first direction by approximately 0.24 mm or more.

10. The package of claim 6, wherein the array of light emitter chips within the LED populated area comprise an asymmetric or non-repetitive pattern.

11. The package of claim 6, wherein the array of light emitter chips within the LED populated area comprise a repetitive pattern.

12. The package of claim 1, wherein the submount comprises an area of approximately 88 mm$^2$ or more.

13. The package of claim 1, wherein the submount comprises a primary lens efficacy zone area of approximately 10 mm$^2$ or more.

14. The package of claim 1, wherein the package has an efficacy of at least approximately 100 lumens per watt (LPW) or more at an input power of 10 watts (W).

15. The package of claim 14, wherein the package has a color temperature of approximately 4000 K and an input power of approximately 10 W.

16. The package of claim 1, wherein a scotopic/photopic (S/P) ratio is greater than 2.

17. The package of claim 1, wherein a scotopic/photopic (S/P) ratio is less than 2.

18. The package of claim 6, wherein the LED populated area comprises 54 blue shifted yellow (BSY) light emitting diode (LED) chips and 30 red-orange (RDO) LED chips.

19. The package of claim 6, wherein the LED populated area comprises 54 blue shifted yellow (BSY) light emitting diode (LED) chips and 16 red-orange (RDO) LED chips.

20. The package of claim 6, wherein the LED populated area comprises 48 blue shifted yellow (BSY) light emitting diode (LED) chips and 30 red-orange (RDO) LED chips.

21. The package of claim 6, wherein the LED populated area comprises 48 blue shifted yellow (BSY) light emitting diode (LED) chips and 48 red-orange (RDO) LED chips.

22. The package of claim 6, wherein the LED populated area comprises 16 blue shifted yellow (BSY) light emitting diode (LED) chips and 16 red-orange (RDO) LED chips.

23. The package of claim 6, wherein the LED populated area comprises 23 blue shifted yellow (BSY) light emitting diode (LED) chips and 22 red-orange (RDO) LED chips.

* * * * *